United States Patent
Williams et al.

(10) Patent No.: US 12,540,957 B2
(45) Date of Patent: Feb. 3, 2026

(54) VOLTAGE MONITORING SYSTEM AND METHOD FOR HARVESTING ENERGY IN A COMPUTATIONAL ENVIRONMENT

(71) Applicant: KRYPTOWIRE LLC, McLean, VA (US)

(72) Inventors: Harrison Ridgway Williams, Blacksburg, VA (US); Matthew David Hicks, Blacksburg, VA (US); Angelos Stavrou, Fairfax, VA (US); Michael Antoine Moukarzel, Philadelphia, PA (US)

(73) Assignee: A2 LABS, LLC, Arlington, VA (US)

(*) Notice: Subject to any disclaimer, the term of this patent is extended or adjusted under 35 U.S.C. 154(b) by 449 days.

(21) Appl. No.: 18/335,008

(22) Filed: Jun. 14, 2023

(65) Prior Publication Data

US 2023/0400482 A1    Dec. 14, 2023

Related U.S. Application Data

(60) Provisional application No. 63/352,149, filed on Jun. 14, 2022.

(51) Int. Cl.
*G01R 19/25* (2006.01)
*H02J 50/00* (2016.01)

(52) U.S. Cl.
CPC .......... *G01R 19/25* (2013.01); *H02J 50/001* (2020.01)

(58) Field of Classification Search
CPC .............. G01R 19/25; G01R 19/16552; G01R 19/2503; G01R 19/2513; H02J 50/001
See application file for complete search history.

(56) References Cited

U.S. PATENT DOCUMENTS

| 6,163,224 A | * | 12/2000 | Araki | ...................... H03K 3/03 331/34 |
| 2020/0089299 A1 | * | 3/2020 | Kim | ...................... H03L 7/0997 |

FOREIGN PATENT DOCUMENTS

WO    WO-2021212288 A1 * 10/2021    ............... G05F 1/46

OTHER PUBLICATIONS

A. Colin and B. Lucia, "Chain: Tasks and channels for reliable intermittent programs," in International Conference on Object-Oriented Programming, Systems, Languages, and Applications, ser. OOPSLA, Oct. 2016, pp. 514-530.

(Continued)

*Primary Examiner* — Eman A Alkafawi
*Assistant Examiner* — Dilara Sultana
(74) *Attorney, Agent, or Firm* — Mannava & Kang, P.C.

(57) ABSTRACT

A voltage monitoring system and a method for harvesting energy is disclosed. A system includes a ring oscillator circuit, which incorporates delay line circuit composed of series of inverting logic gates. The final inverting logic gate forms self-oscillating feedback loop by connecting its output to the input of the first logic gate. To interface with ring oscillator circuit, transistor-based voltage divider circuit is implemented. The transistor-based voltage divider circuit utilizes multiple diode-connected transistor devices, with bulk terminals interconnected to the respective source terminals. Enable signal controls final diode-connected transistor device at its gate terminal. Furthermore, a voltage-level shifter circuit is connected to output of inverting logic gates, enabling seamless integration with ring oscillator circuit. Finally, a counter circuit is linked to voltage-level shifter circuit, utilizing its output terminal. The counter circuit is connected to external system responsible for harvesting energy, which powers the computational task performed by the system.

20 Claims, 23 Drawing Sheets

(56) References Cited

OTHER PUBLICATIONS

A. Devices, "Ltspice," Sep. 2020, (hhttps://www.analog.com/en/design-center/design-tools-and-calculators/ltspice-simulator.html.).
A. Jayaraj, M. Danesh, S. T. Chandrasekaran, and A. Sanyal, "Highly digital second-order $\Delta \Sigma$ VCO ADC," IEEE Transactions on Circuits and Systems I: Regular Papers, vol. 66, No. 7, pp. 2415-2425, 2019.
A. Sanyal, S. Li, and N. Sun, "Low-power scaling-friendly ring oscillator based σδ adc," in 2018 IEEE International Symposium on Circuits and Systems (ISCAS), 2018, pp. 1-5.
Analog Devieces, "Micropower, 3-Axis, ±2g/±4g/±8gDigitalOutput MEMS Accelerometer," 2015, 47 pages. https://www.analog.com/media/en/technicaldocumentation/data-sheets/ADXL362.pdf.
B. Denby et al., "Orbital edge computing: Nanosatellite constellations as a new class of computer system," in Proceedings of the Twenty-Fifth International Conference on Architectural Support for Programming Languages and Operating Systems, ser. ASPLOS '20. New York, NY, USA: Association for Computing Machinery, 2020, p. 939-954. [Online]. Available: https://doi.org/10.1145/3373376.3378473.
B. E. Jonsson, "A survey of A/D-converter performance evolution," in International Conference on Electronics, Circuits, and Systems, ser. ICECS, Dec. 2010, pp. 766-769.
B. Lucia et al., "A simpler, safer programming and execution model for intermittent systems," in Conference on Programming Language Design and Implementation, ser. PLDI '15, Jun. 13-17, 2015, pp. 575-585.
B. Ransford et al., "Mementos: System Support for Long-Running Computation on RFID-Scale Devices," in Architectural Support for Programming Languages and Operating Systems (ASPLOS), Mar. 5-11, 2011, pp. 159-170.
D. Balsamo et al., "Hibernus++: A self-calibrating and adaptive system for transiently-powered embedded devices," IEEE Transactions on Computer-Aided Design of Integrated Circuits and Systems, vol. 35, No. 12, pp. 1968-1980, 2016.
D. Balsamo et al., "Hibernus: Sustaining computation during intermittent supply for energy-harvesting systems," IEEE Embedded Systems Letters, vol. 7, No. 1, pp. 15-18, Mar. 2015.
G. Ge, C. Zhang, G. Hoogzaad, and K. A. A. Makinwa, "A single-trim CMOS bandgap reference with a $3\sigma$ inaccuracy of ±0.15% from −40° C. to 125° C.," IEEE Journal of Solid-State Circuits, vol. 46, No. 11, pp. 2693-2701, Nov. 2011.
G. Gobieski, A. Nagi, N. Serafin, M. M. Isgenc, N. Beckmann, and B. Lucia, "Manic: A vector-dataflow architecture for ultra-low-power embedded systems," in Proceedings of the 52nd Annual IEEE/ACM International Symposium on Microarchitecture, ser. MICRO '52. New York, NY, USA: Association for Computing Machinery, 2019, p. 670-684. [Online]. Available: https://doi.org/10.1145/3352460.3358277.
G. Jovanovi'c, M. Stojcev, and Z. Stamenkovic, "A cmos voltage controlled ring oscillator with improved frequency stability," Scientific Publications of the State University of Novi Pazar: Applied Mathematics, Informatics, and Mechanics, vol. 2, pp. 1-9, Jun. 2010.
H. Desai and B. Lucia, "A power-aware heterogeneous architecture scaling model for energy-harvesting computers," IEEE Computer Architecture Letters, vol. 19, No. 1, pp. 68-71, 2020.
H. Jayakumar et al., "QUICKRECALL: A Low Overhead HW/SW Approach for Enabling Computations across Power Cycles in Transiently Powered Computers," in 27th International Conference on VLSI Design and 13th International Conference on Embedded Systems, 2014, pp. 330-335.
H. Sodano et al., "Estimation of Electric Charge Output for Piezoelectric Energy Harvesting," in Strain, vol. 40, 2004, pp. 49-58.
H. Williams et al., "Forget failure: Exploiting SRAM data remanence for low-overhead intermittent computation," in Proceedings of the Twenty-Fifth International Conference on Architectural Support for Programming Languages and Operating Systems, ser. ASPLOS '20, Mar. 16-20, 2020, pp. 69-84.
IBM, "Changing the way the world works: IBM Research's "5 in 5"", Mar. 19, 2019, 8 pages.
J. Blank and K. Deb, "Pymoo: Multi-objective optimization in python," IEEE Access, vol. 8, pp. 89 497-89 509, 2020.
J. Hester et al., "Ekho: Realistic and repeatable experimentation for tiny energy-harvesting sensors," in Proceedings of the 12th ACM Conference on Embedded Network Sensor Systems, Nov. 3-5, 2014, 15 pages.
J. Park and J. A. Abraham, "A fast, accurate and simple critical path monitor for improving energy-delay product in dvs systems," in IEEE/ACM International Symposium on Low Power Electronics and Design, 2011, pp. 391-396.
J. Tschanz, K. Bowman, S. Walstra, M. Agostinelli, T. Karnik, and V. De, "Tunable replica circuits and adaptive voltage-frequency techniques for dynamic voltage, temperature, and aging variation tolerance," in 2009 Symposium on VLSI Circuits, 2009, pp. 112-113.
J. V. D. Woude et al., "Intermittent computation without hardware support or programmer intervention," in 12th USENIX Symposium on Operating Systems Design and Implementation (OSDI 16). Savannah, GA: USENIX Association, Nov. 2016,pp. 17-32. [Online]. Available: https://www.usenix.org/conference/osdi16/technical-sessions/presentation/vanderwoude.
K. Asanovic et al., "The Rocket chip generator," EECS Department, University of California, Berkeley, Tech. Rep. UCB/EECS-2016-17, Apr. 2016.
K. M. Zick and J. P. Hayes, "Low-cost sensing with ring oscillator arrays for healthier reconfigurable systems," ACM Trans. Reconfigurable Technol. Syst., vol. 5, No. 1, Mar. 2012. [Online]. Available: https://doi.org/10.1145/2133352.2133353.
K. Ma et al., "Architecture exploration for ambient energy harvesting nonvolatile processors," in IEEE International Symposiumon High Performance Computer Architecture, ser. HPCA, Feb. 2015, pp. 526-537.
K. Maeng and B. Lucia, "Adaptive dynamic checkpointing for safe efficient intermittent computing," in 13th USENIX Symposium on Operating Systems Design and Implementation (OSDI 18). Carlsbad, CA: USENIX Association, Oct. 2018, pp. 129-144. [Online]. Available: https://www.usenix.org/conference/osdi18/presentation/maeng.
K. Maeng et al., "Supporting peripherals in intermittent systems with just-in-time checkpoints," in Proceedings of the 40th ACM SIGPLAN Conference on Programming Language Design and Implementation, ser. PLDI 2019. New York, NY, USA: Association for Computing Machinery, 2019, p. 1101-1116. [Online]. Available: https://doi.org/10.1145/3314221.3314613.
K. Maeng, A. Colin, and B. Lucia, "Alpaca: Intermittent execution without checkpoints," in International Conference on Object-Oriented Programming, Systems, Languages, and Applications, ser. OOPSLA, Oct. 2017, pp. 96:1-96:30.
L. R. Wolfgang Lutsch, "Energy optimization tools for ultra-low-power microcontrollers," 2020, 5 pages. [Online]. Available: https://www.mouser.com/applications/low-power-ewc-design/.
M. Alhaideri et al., "The moo and cement shoes: Future directions of a practical sense-control-actuate application," Sep. 2013, presented at First International Workshop on the Swarm at the Edge of the Cloud (SEC'13 @ ESWeek),Montreal. [Online]. Available: http://terraswarm.org/pubs/111.html.
M. Alioto and G. Palumbo, "Impact of supply voltage variations on full adder delay: Analysis and comparison," IEEE Transactions on Very Large Scale Integration (VLSI) Systems, vol. 14, No. 12, pp. 1322-1335, 2006.
M. Bhushan and M. B. Ketchen, "Generation, elimination and utilization of harmonics in ring oscillators," in 2010 International Conference on Microelectronic Test Structures (ICMTS), 2010, pp. 108-113.
M. Bhushan, A. Gattiker, M. B. Ketchen, and K. K. Das, "Ring oscillators for CMOS process tuning and variability control," IEEE Transactions on Semiconductor Manufacturing, vol. 19, No. 1, pp. 10-18, 2006.
M. Buettner et al., "Dewdrop: An energy-aware runtime for computational RFID," in Proceedings of the 8th USENIX Conference

(56) References Cited

OTHER PUBLICATIONS on Networked Systems Design and Implementation, ser. NSDI'11. USA: USENIX Association, 2011, p. 197-210.

M. Buettner et al., "Rfid sensor networks with the intel wisp," in Proceedings of the 6th ACM Conference on Embedded Network Sensor Systems, ser. SenSys '08. New York, NY, USA: Association for Computing Machinery, 2008, p. 393-394. [Online]. Available: https://doi.org/10.1145/1460412.1460468.

M. Danesh, S. T. Chandrasekaran, and A. Sanyal, "Ring oscillator based delta-sigma adcs," in 2018 25th IEEE International Conference on Electronics, Circuits and Systems (ICECS), 2018, pp. 113-116.

M. Gorlatova, A. Wallwater, and G. Zussman, "Networking low-power energy harvesting devices: Measurements and algorithms," in 2011 Proceedings IEEE Infocom, 2011, pp. 1602-1610.

M. Hempstead, G.-Y. Wei, and D. Brooks, "Architecture and circuit techniques for low-throughput, energy-constrained systems across technology generations," in Proceedings of the 2006 International Conference on Compilers, Architecture and Synthesis for Embedded Systems, ser. CASES '06. New York, NY, USA: Association for Computing Machinery, 2006, p. 368-378. [Online]. Available: https://doi.org/10.1145/1176760.1176805.

M. Hempstead, N. Tripathi, P. Mauro, Gu-Yeon Wei, and D. Brooks, "An ultra low power system architecture for sensor network applications," in 32nd International Symposium on Computer Architecture (ISCA'05), 2005, pp. 208-219.

M. Hicks, "Clank: Architectural support for intermittent computation," in 2017 ACM/IEEE 44th Annual International Symposium on Computer Architecture (ISCA), 2017, pp. 228-240.

M. K. Mandal and B. C. Sarkar, "Ring oscillators: Characteristics and applications," Indian Journal of Pure & Applied Physics, vol. 48, No. 1, pp. 136-145, 2010.

M. Kulkarni and K. Hosur, "Design of a linear and wide range current starved voltage controlled oscillator for PLL," International Journal on Cybernetics & Informatics, vol. 2, pp. 23-30, Feb. 2013.

M. R. Halesh, K. R. Rasane, and H. Rohini, "Design and implementation of voltage control oscillator (VCO) using 180nm technology," in Advances in Computing, Communication and Control, S. Unnikrishnan, S. Surve, and D. Bhoir, Eds. Berlin, Heidelberg: Springer Berlin Heidelberg, 2011, pp. 472-478.

M. Yano, J. D. Penn, G. Konidaris, and A. T. Patera, "Interpolation," Aug. 2013, 15 pages.(https://ocw.mit.edu/courses/mechanicalengineering/2-086-numerical-computation-for-mechanical-engineersfall-2014/nutshells-guis/MIT2086F14 Interpolation.pdf.).

Microchip, "PIC16(L)F15356/75/76/85/86, Full-Feature 28/40/44/48-Pin Microcontrollers" 2016, (https://ww1.microchip.com/downloads/aemDocuments/documents/OTH/ProductDocuments/DataSheets/PIC16LF15356-75-76-85-86-DataSheet-40001866B.pdf).

N. A. Bhatti and L. Mottola, "HarvOS: Efficient code instrumentation for transiently-powered embedded sensing," in 2017 16th ACM/IEEE International Conference on Information Processing in Sensor Networks (IPSN), 2017, pp. 209-220.

P. Prabha, S. J. Kim, K. Reddy, S. Rao, N. Griesert, A. Rao, G. Winter, and p. K. Hanumolu, "A highly digital VCO-based ADC architecture for current sensing applications," IEEE Journal of Solid-State Circuits, vol. 50, No. 8, pp. 1785-1795, 2015.

R. H. Dennard, F. H. Gaensslen, H. Yu, V. L. Rideout, E. Bassous, and A. R. LeBlanc, "Design of Ion-Implanted MOSFET's with very small physical dimensions," IEEE Journal of Solid-State Circuits, vol. 9, No. 5, pp. 256-268, 1974.

R. Jurdak et al., "Mote-based underwater sensor networks: Opportunities, challenges, and guidelines," Feb. 16, 2008, 37 pages.

R. Kumar and V. Kursun, "Modeling of temperature effects on nanocmos devices with the predictive technologies," in 2007 50th Midwest Symposium on Circuits and Systems, 2007, pp. 694-697.

S. Park, C. Min, and S. Cho, "A 95nw ring oscillator-based temperature sensor for rfid tags in 0.13um cmos," in 2009 IEEE International Symposium on Circuits and Systems, 2009, pp. 1153-1156.

T. Chan, P. Gupta, A. B. Kahng, and L. Lai, "Ddro: A novel performance monitoring methodology based on design-dependent ring oscillators," in Thirteenth International Symposium on Quality Electronic Design (ISQED), 2012, pp. 633-640.

T. D. Burd, T. A. Pering, A. J. Stratakos, and R. W. Brodersen, "A dynamic voltage scaled microprocessor system," IEEE Journal of solid-state circuits, vol. 35, No. 11, pp. 1571-1580, Nov. 2000.

Testequity, "Model 123H Temperature/Humidity Chamber With F4 Controller and EZ-Zone Limit Operation and Service Manual," 2010, 77 pages.(https://www.testequity.com/UserFiles/documents/pdfs/123Hman.pdf.).

Texas Instruments, "ADS7042 Ultra-LowPower, Ultra-Small Size, 12-Bit, 1-MSPS, SAR ADC," Dec. 2015, 46 pages.(https://www.ti.com/lit/ds/sbas608c/sbas608c.pdf.).

Texas Instruments, "Mixed Signal Microcontroller," May 2013,81 pages.(https://www.ti.com/lit/ds/symlink/msp430g2553.pdf.).

Texas Instruments, "MSP430FR596x, MSP430FR594x Mixed-Signal Microcontrollers," 2018, 146 pages.(https://www.ti.com/lit/ds/symlink/msp430fr5969.pdf.).

Texas Instruments, "Msp432p401r, msp432p401m simplelink mixedsignal microcontrollers," Jun. 2019, 200 pages, https://www.ti.com/lit/ds/symlink/msp432p401r.pdf.

U. Karthaus et al., "Fully Integrated Passive UHF RFID Transponder IC With 16.7-µ W Minimum RF Input Power," in IEEEJournal of Solid-State Circuits, vol. 38, No. 10, Oct. 2003, pp. 1602-1608.

V. Gutnik and A. Chandrakasan, "An efficient controller for variable supply-voltage low power processing," in 1996 Symposium on VLSI Circuits. Digest of Technical Papers, 1996, pp. 158-159.

W. Xu, X. Chen, and J. Wu, "An overview of theory and techniques for reducing ring oscillator supply voltage sensitivity in mixed-signal soc," in 2011 International Conference on Mechatronic Science, Electric Engineering and Computer (MEC), 2011, pp. 2039-2042.

X. Wu et al., "A 0.04mm3 16nW wireless and batteryless sensor system with integrated cortex-m0+ processor and optical communication for cellular temperature measurement," in 2018 IEEE Symposium on VLSI Circuits, 2018, pp. 191-192.

Xilinx, "7 series FPGAs data sheet: Overview," DS180 (v2.6.1) Sep. 8, 2020, 19 pages. [Online]. Available: https://www.xilinx.com/support/documentation/data sheets/ds180 7Series Overview.pdf.

Xilinx, "Artix-7 fpgas data sheet: Dc and ac switching characteristics," 2018. [Online]. Available: https://www.xilinx.com/support/documentation/data sheets/ds181 Artix 7 Data Sheet.pdf.

Y. Cao, T. Sato, M. Orshansky, D. Sylvester, and C. Hu, "New paradigm of predictive mosfet and interconnect modeling for early circuit simulation," in Proceedings of the IEEE 2000 Custom Integrated Circuits Conference (Cat. No. 00CH37044), 2000, pp. 201-204.

Y. K. Ramadass et al., "An efficient piezoelectric energy harvesting interface circuit using a bias-flip rectifier and shared inductor," IEEE Journal of Solid-State Circuits, vol. 45, No. 1, pp. 189-204, Jan. 2010.

\* cited by examiner

VOLTAGE MONITORING SYSTEM AND METHOD FOR HARVESTING ENERGY IN A COMPUTATIONAL ENVIRONMENT

CROSS-REFERENCE TO RELATED APPLICATION(S)

This application claims priority to incorporate by reference the entire disclosure of U.S. provisional patent application No. 63/352,149, filed on Jun. 14, 2022, titled "Intermittent computation via low-cost hardware support for voltage monitoring".

STATEMENT REGARDING FEDERALLY SPONSORED RESEARCH OR DEVELOPMENT

This invention was made with U.S. government support under grant No. HR00112000154 awarded by the Department of Defense. The U.S. government has certain rights in the invention.

TECHNICAL FIELD

Embodiments of the present disclosure generally relate to voltage monitoring systems, and more particularly relates to a voltage monitoring system and method for harvesting energy in a computational environment.

BACKGROUND

Generally, energy harvesting systems are used in a variety of applications to support deployment of power or small computing devices untethered by constant power sources or batteries. Such deployment of the low-power or small computing devices enable a longer durability in the deployed variety of applications which were previously limited by power or size constraints. The variety of applications may include monitoring temperatures, securing supply chains and the like even in extreme conditions such as defense, space, or underwater. However, a major challenge for deploying such low-power or small computing devices may include limitation on lifespan of batteries used. This limitation has led to the exploration of the energy harvesting systems as an alternative. In such energy harvesting systems, a battery may be replaced with a transducer to capture energy from the variety of the applications and a buffer capacitor to store the captured energy until it is sufficient to power onboard devices. The source and amount of available energy depends on type of an application in which the low-power or small computing devices are deployed. Moreover, the operation of the low-power or small computing devices for a serviceable duration becomes challenging due to unpredictable nature of harvested energy, a low power output of transducers, and limited buffer size.

Further, even the lowest-power microcontrollers operating intermittently may wait for the energy harvesting system to slowly charge the buffer capacitor and rapidly discharge the buffer capacitor to support a brief burst of computation. The challenges in operating the lowest-power microcontrollers intermittently may be solved using a variety of hardware and software techniques, that first enable long-running computation and then focus on improving performance of the variety of applications. Hence, the energy harvesting systems may demand dynamic updates of the available energy to inform checkpointing and mode decisions.

Currently, conventional energy harvesting systems are based on analog circuits (e.g., analog-to-digital converters or ADC). Such conventional energy harvesting systems may not be matched for the dynamic updates of available energy, because signal processing of the ADC focuses on sacrificing power efficiency for increased performance. This increased performance may not be required by current or future intermittent computation requirements or scenarios. This results in the conventional energy harvesting systems consuming energy as much as the lowest-power microcontrollers deployed. Further, the conventional energy harvesting systems may provide a real-time checkpointing approach for supporting variety of applications during numerous and frequent power failures. This real-time checkpointing approach is performed by saving a snapshot of a program state to nonvolatile memory, when power failure is imminent. Further, the real-time checkpointing approach relies on voltage monitoring and is typically performed using power-intensive analog-to-digital converters (ADCs) or analog voltage comparators. Further, conventional energy harvesting systems may not include an ability to balance performance and energy consumption of the intermittent computation systems according to their specific requirements.

Therefore, there is a need in the art to provide a voltage monitoring system and method for harvesting energy in a computational environment which allows low-power, all-digital, on-chip supply-voltage monitoring solutions with sufficient resolution level and/or sample rate to address the aforementioned deficiencies in the art.

SUMMARY

This summary is provided to introduce a selection of concepts, in a simple manner, which is further described in the detailed description of the disclosure. This summary is neither intended to identify key or essential inventive concepts of the subject matter nor to determine the scope of the disclosure.

An aspect of the present disclosure provides a voltage monitoring system. The voltage monitoring system includes a ring oscillator circuit including a delay line circuit. The delay line circuit includes a series of inverting logic gates. Each of the inverting logic gates includes a first input terminal, a second input terminal, and an intermediate output terminal. The series of inverting logic gates includes a final inverting logic gate including a first input terminal, a second input terminal, an enable input terminal, and a final output terminal. The final output terminal of the final inverting logic gate being looped to the first input terminal of a first inverting logic gate to form a self-oscillating feedback loop. Further, the voltage monitoring system includes a transistor-based voltage divider circuit connected to the ring oscillator circuit via the second input terminal of the inverting logic gates. The transistor-based voltage divider circuit includes a plurality of diode connected transistor devices with each bulk terminal of diode connected transistor device connected to each source terminal of the diode connected transistor device. The plurality of diode connected transistor devices includes a final diode connected transistor device fed with an enable signal at a gate terminal of the final diode connected transistor device. Furthermore, the voltage monitoring system includes a voltage-level shifter circuit connected to the ring oscillator circuit via an intermediate output terminal of the inverting logic gates. Additionally, the voltage monitoring system includes a counter circuit connected to the voltage-level shifter circuit via an output terminal of the voltage-level shifter circuit. The counter circuit being connected to an external system for harvesting energy to perform a computational task.

Another aspect of the present disclosure includes a computing system for harvesting energy. The computing system includes a hardware processor and an intermittent computation circuit communicatively connected to the hardware processor. The intermittent computation circuit is to monitor a buffer capacitor voltage for the intermittent computation circuit. Further, the computing system includes a voltage monitoring system communicatively coupled to the intermittent computation circuit via the hardware processor. The voltage monitoring system includes a transistor-based voltage divider circuit to tune a ring oscillator circuit by operating the ring oscillator circuit in a preferred voltage region. The transistor-based voltage divider circuit being supplied with a supply voltage. Further, the voltage monitoring system includes the ring oscillator circuit to generate a voltage dependent ring oscillator frequency based on a tapped voltage of the transistor-based voltage divider circuit. Furthermore, the voltage monitoring system includes a voltage-level shifter circuit to generate a level shifted output signal by shifting a voltage level of an intermediate output signal received from the ring oscillator circuit. The generated level-shifted output signal corresponds to a voltage level required by the intermittent computation circuit. Additionally, the voltage monitoring system includes a counter circuit to generate a count value during a sampling period by incrementing an initial count value for each positive edge of the level-shifted output signal. Further, the voltage monitoring system includes the intermittent computation circuit is to determine available energy level for computation by monitoring the buffer capacitor voltage for the intermittent computation circuit. The buffer capacitor voltage being monitored by mapping the count value to values of a pre-defined supply voltage.

Yet another aspect of the present disclosure provides a method for harvesting energy using a digital voltage monitoring system. The method includes measuring a voltage dependent ring oscillator frequency at a ring oscillator circuit for a range of supply voltage levels. Further, the method includes determining a performance parameter for each of the measured voltage dependent ring oscillator frequency, the performance parameter including a resolution level, and a sample rate. Furthermore, the method includes generating a level shifted output signal by shifting voltage level of the ring oscillator circuit to a voltage level required by an intermittent computation circuit based on the determined performance parameter. Additionally, the method includes generating a count value during a sampling period by incrementing an initial count value for each positive edge of the generated level-shifted output signal. Further, the method includes determining an optimal supply voltage value for the intermittent computation circuit by mapping the count value to values of a pre-defined supply voltage. Furthermore, the method includes identifying an available energy level for computation based on the generated count values and the determined supply voltage value. The available energy level corresponds to a n-bit value stored in a destination register of the intermittent computation circuit.

To further clarify the advantages and features of the present disclosure, a more particular description of the disclosure will follow by reference to specific embodiments thereof, which are illustrated in the appended figures. It is to be appreciated that these figures depict only typical embodiments of the disclosure and are therefore not to be considered limiting in scope. The disclosure will be described and explained with additional specificity and detail with the appended figures.

BRIEF DESCRIPTION OF ACCOMPANYING DRAWINGS

The disclosure will be described and explained with additional specificity and detail with the accompanying figures in which.

Figure 5A:
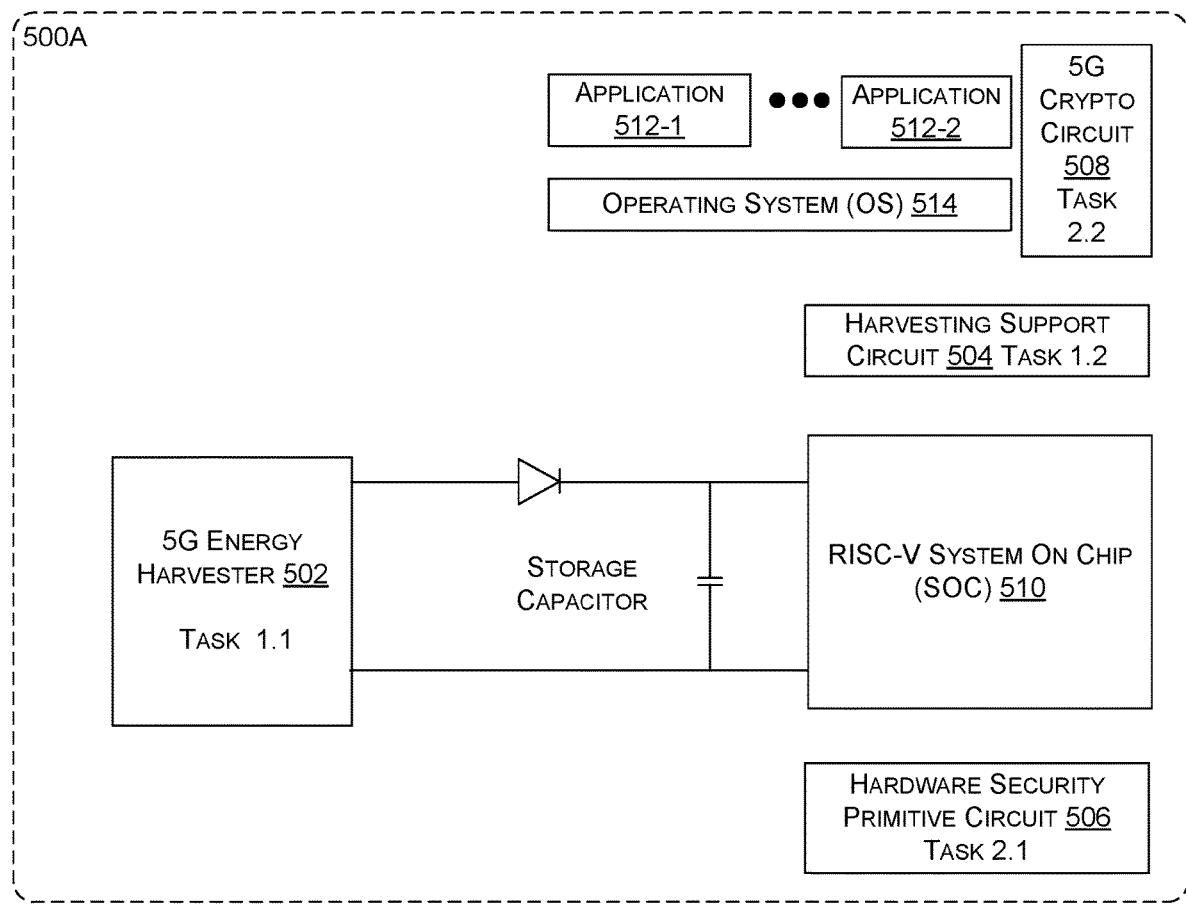
FIGS. 5A and 5B illustrate block diagram and circuit diagram representations of a combination of fifth-generation (5G) energy harvester with an intermittent computation circuit, and a combination of an energy harvester with a microcontroller unit (MCU) that implements an intermittent computation, respectively, according to an example embodiment of the present disclosure.
Figure 7A:
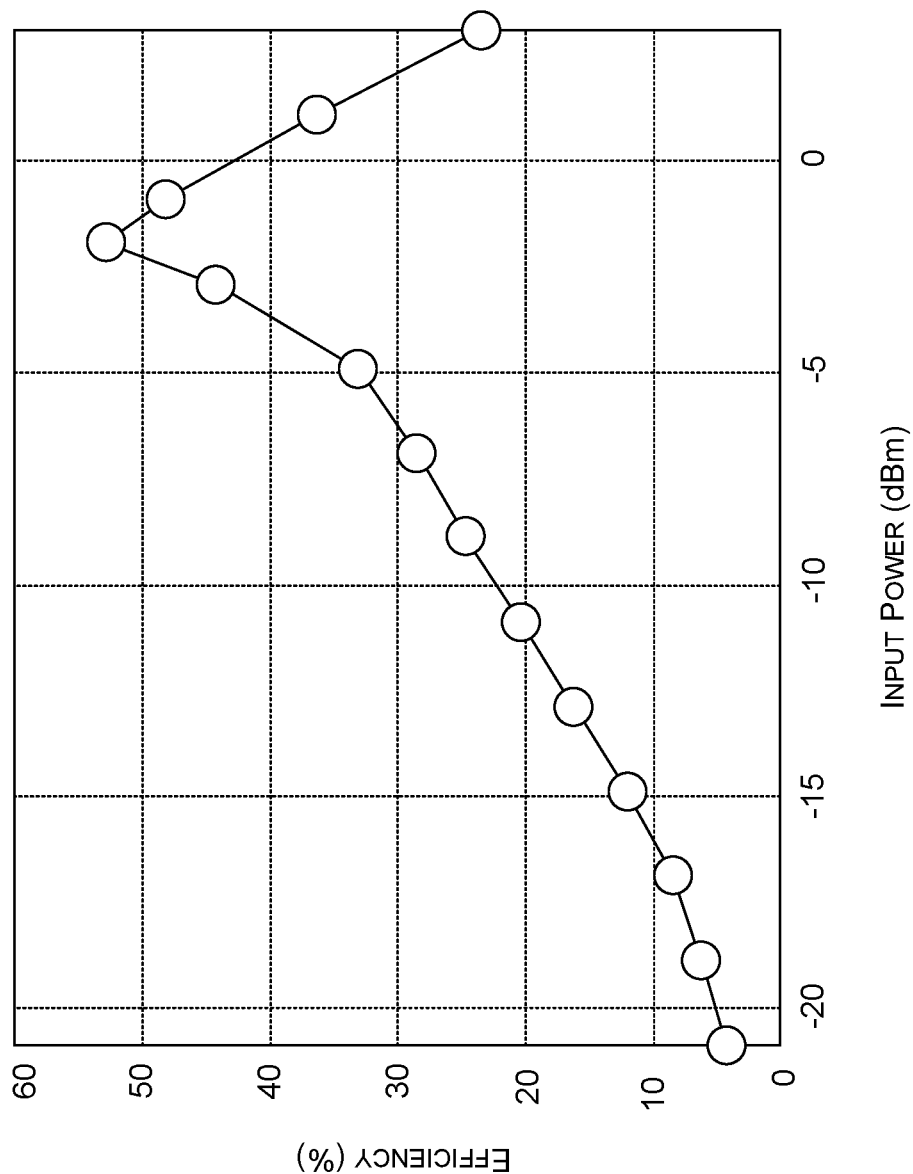
FIG. 7A illustrates an exemplary graph diagram representation of a measured power conversion efficiency of the rectenna, according to an example embodiment of the present disclosure.
Figure 7B:
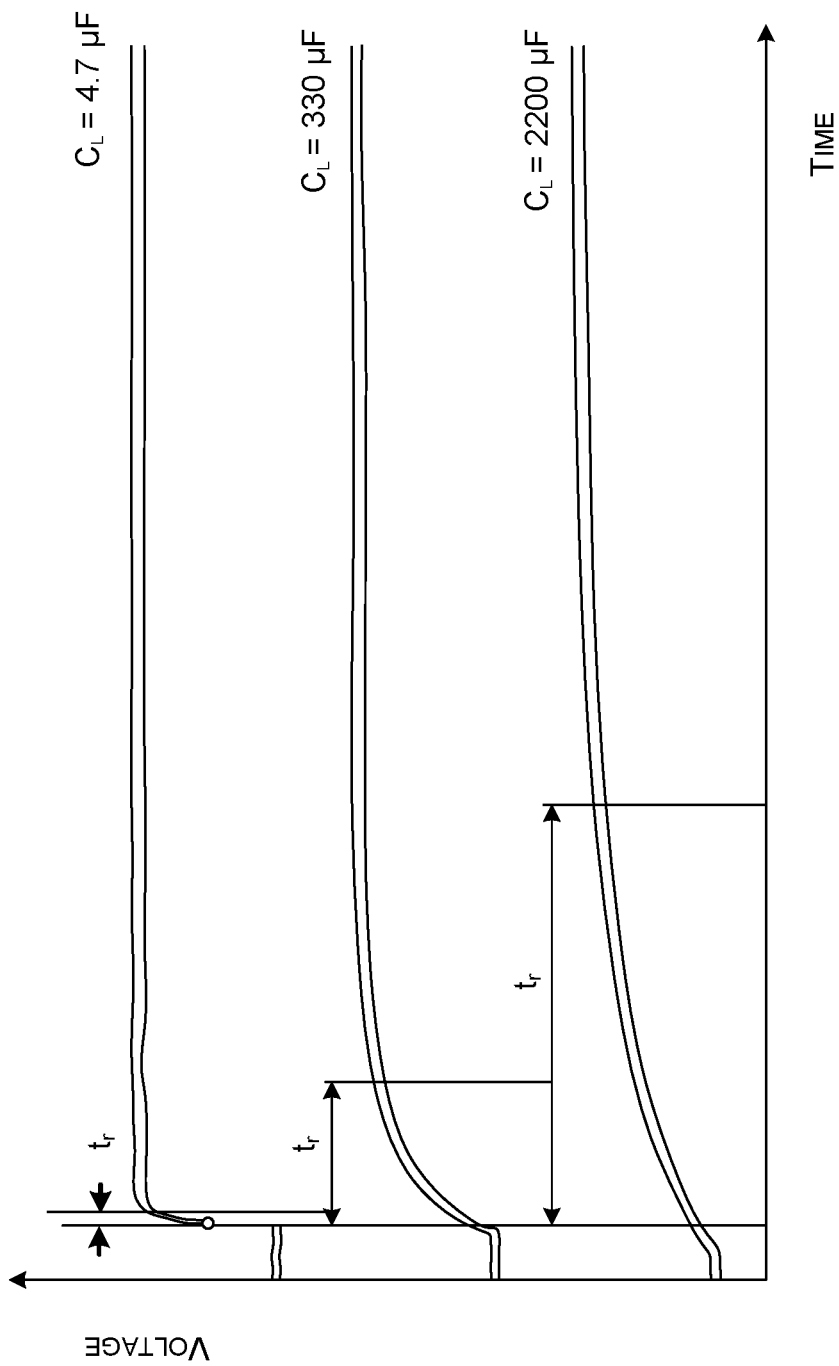
FIG. 7B illustrates an exemplary graph diagram representation of voltage waveforms across a load capacitor $C_L$ such as those shown in FIG. 3B, according to an example embodiment of the present disclosure.
Figure 7C:
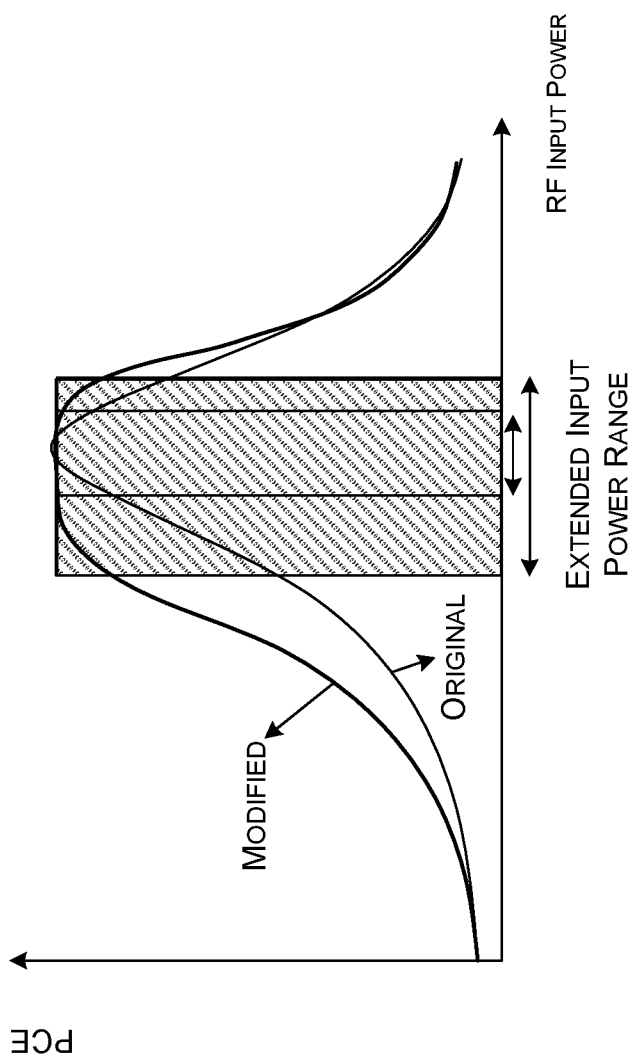
FIG. 7C illustrates an exemplary schematic diagram representation of an extended peak range for power conversion efficiency (PCE), according to an example embodiment of the present disclosure.
Figure 7D:
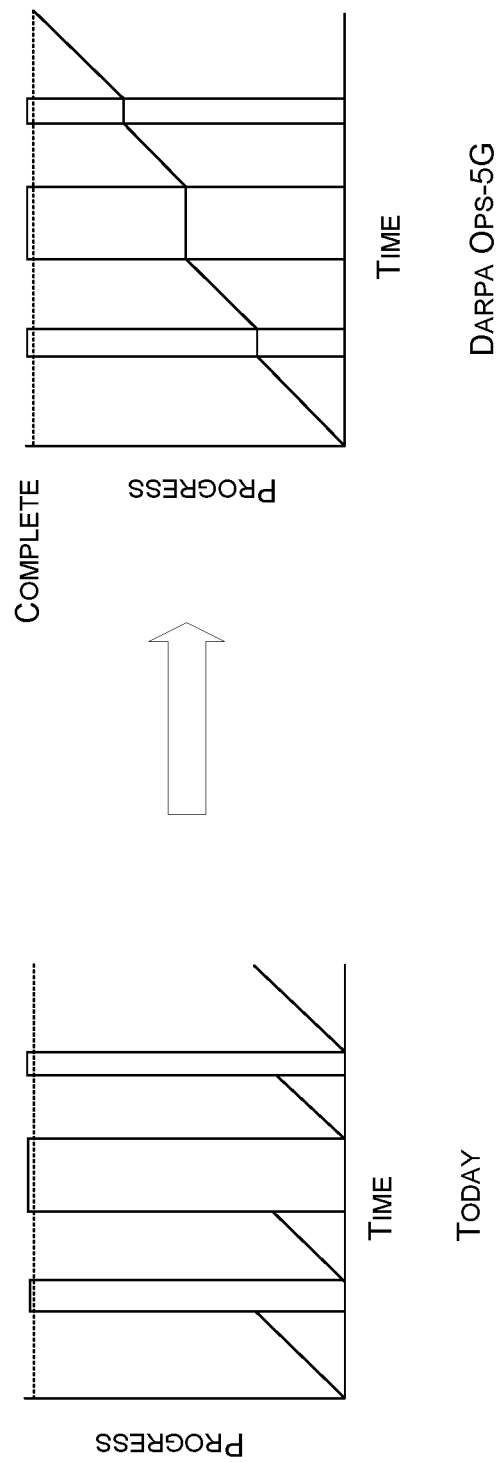
Figure 8:
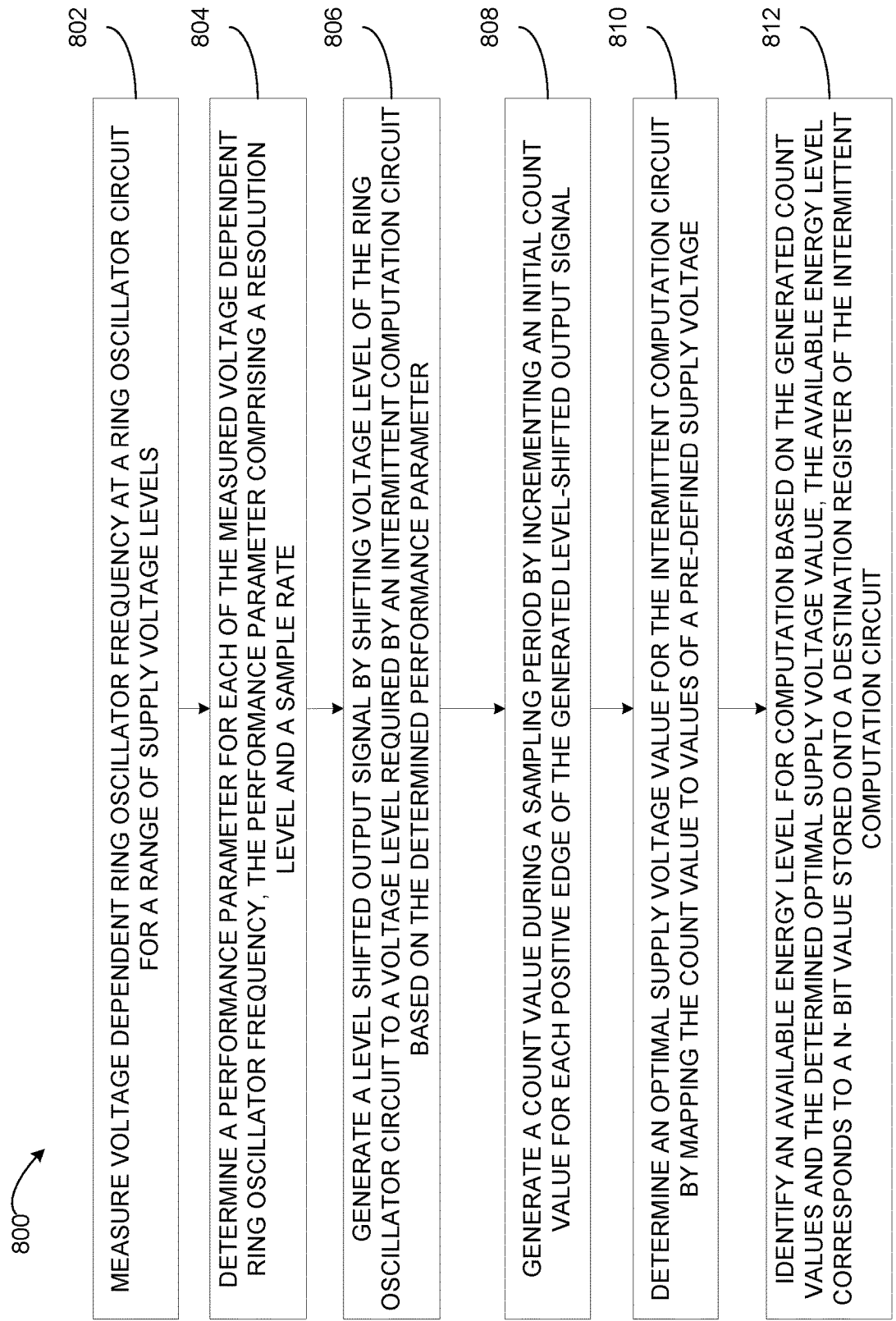

FIG. 7D illustrates an exemplary graph diagram representation of results for a combination of the fifth generation (5G) energy harvester with intermittent computation circuit shown in FIG. 5A, according to another example embodiment of the present disclosure; and FIG. 8 illustrates an exemplary flow diagram representation of a method for harvesting energy using the digital voltage monitoring system, according to an example embodiment of the present disclosure.

Further, those skilled in the art will appreciate that elements in the figures are illustrated for simplicity and may not have necessarily been drawn to scale. Furthermore, in terms of the construction of the device, one or more components of the device may have been represented in the figures by conventional symbols, and the figures may show only those specific details that are pertinent to understanding the embodiments of the present disclosure so as not to obscure the figures with details that will be readily apparent to those skilled in the art having the benefit of the description herein.

DETAILED DESCRIPTION

For simplicity and illustrative purposes, the present disclosure is described by referring mainly to examples thereof. The examples of the present disclosure described herein may be used together in different combinations. In the following description, details are set forth in order to provide an understanding of the present disclosure. It will be readily apparent, however, that the present disclosure may be practiced without limitation to all these details. Also, throughout the present disclosure, the terms "a" and "an" are intended to denote at least one of a particular element. The terms "a" and "an" may also denote more than one of a particular element. As used herein, the term "includes" means includes but not limited to, the term "including" means including but not limited to. The term "based on" means based at least in part on, the term "based upon" means based at least in part upon, and the term "such as" means such as but not limited to. The term "relevant" means closely connected or appropriate to what is being performed or considered.

For the purpose of promoting an understanding of the principles of the disclosure, reference will now be made to the embodiment illustrated in the figures and specific language will be used to describe them. It will nevertheless be understood that no limitation of the scope of the disclosure is thereby intended. Such alterations and further modifications in the illustrated system, and such further applications of the principles of the disclosure as would normally occur to those skilled in the art are to be construed as being within the scope of the present disclosure. It will be understood by those skilled in the art that the foregoing general description and the following detailed description are exemplary and explanatory of the disclosure and are not intended to be restrictive thereof.

In the present document, the word "exemplary" is used herein to mean "serving as an example, instance, or illustration". Any embodiment or implementation of the present subject matter described herein as "exemplary" is not necessarily to be construed as preferred or advantageous over other embodiments. The terms "comprise", "comprising", or any other variations thereof, are intended to cover a non-exclusive inclusion, such that one or more devices or sub-systems or elements or structures or components preceded by "comprises . . . a" does not, without more constraints, preclude the existence of other devices, sub-systems, additional sub-modules. Appearances of the phrase "in an embodiment", "in another embodiment", "in an exemplary embodiment" and similar language throughout this specification may, but not necessarily do, all refer to the same embodiment.

Unless otherwise defined, all technical and scientific terms used herein have the same meaning as commonly understood by those skilled in the art to which this disclosure belongs. The system, methods, and examples provided herein are only illustrative and not intended to be limiting. A computer system (standalone, client, or server, or computer-implemented system) configured by an application may constitute a "module" (or "subsystem") that is configured and operated to perform certain operations. In one embodiment, the "module" or "subsystem" may be implemented mechanically or electronically, so a module includes dedicated circuitry or logic that is permanently configured (within a special-purpose processor) to perform certain operations. In another embodiment, a "module" or a "subsystem" may also comprise programmable logic or circuitry (as encompassed within a general-purpose processor or other programmable processor) that is temporarily configured by software to perform certain operations. Accordingly, the term "module" or "subsystem" should be understood to encompass a tangible entity, be that an entity that is physically constructed permanently configured (hardwired), or temporarily configured (programmed) to operate in a certain manner and/or to perform certain operations described herein.

Embodiments described herein provide a voltage monitoring system and a method for harvesting energy in a computational environment. The present disclosure provides a system and a method for intermittent computation via a low-cost hardware support for voltage monitoring. The present disclosure provides an on-chip, a low power, a fully digital, and reference-free energy monitoring circuit. Further, the present disclosure leverages a predictable propagation delay response of digital logic gates to supply voltage fluctuations. This supply voltage fluctuations are used to measure available energy in intermittent computation circuits. Additionally, the present disclosure provides systems and methods for counting number of times an output signal from a final inverting logic gate traverses a self-oscillating feedback loop during a fixed period as a reference-free indicator of buffer capacitor voltage. This count number indicates an available energy level in the intermittent computation circuit. Furthermore, the present disclosure enables designers to build a required resolution rate and a sample rate to meet at a near-zero additional power and area. The present disclosure provides a ring oscillator circuit, which operates in low-voltage, and a high-sensitivity region to reduce voltage error.

An embodiment of present disclosure relates to a voltage monitoring system and a method for harvesting energy in a computational environment. The voltage monitoring system includes a ring oscillator circuit including a delay line circuit. The ring oscillator circuit may feed a final output signal at an output terminal of the delay line to a first input terminal of the delay line. The output frequency of the ring oscillator is a function of dynamic change in a supply voltage to the ring oscillator. Further, the voltage monitoring system includes a transistor-based voltage divider circuit connected to the ring oscillator circuit via a second input terminal of the delay line circuit. The transistor-based voltage divider circuit may set an operating range for the ring oscillator circuit to tune the ring oscillator circuit to operate in a most-sensitive voltage region or a preferred voltage region. An enable signal may be fed to the second input terminal at a final stage of the delay line circuit and at an input terminal corresponding to a second stage of the voltage divider circuit to change a duty cycle of the ring oscillator circuit.

Further, the voltage monitoring system includes a voltage level shifter circuit connected to the ring oscillator via an intermediate output terminal of the delay line circuit. The voltage level shifter circuit may receive an intermediate output signal from the intermediate output terminal of the delay line circuit, and level shift a voltage of the intermediate output signal to obtain a level-shifted output signal. The level-shifted output signal corresponds to a core voltage required by an intermittent computation circuit or digital processor. Further, the voltage monitoring system includes a counter circuit connected to the level shifter circuit via an output terminal of the level shifter circuit. The counter circuit may increment a counter value for each positive edge of the level-shifted output signal from the level shifter circuit.

Referring now to the drawings, and more particularly to FIG. 1 through FIG. 8, where similar reference characters denote corresponding features consistently throughout the figures, there are shown preferred embodiments and these embodiments are described in the context of the following exemplary system and/or method.

Figure 1:
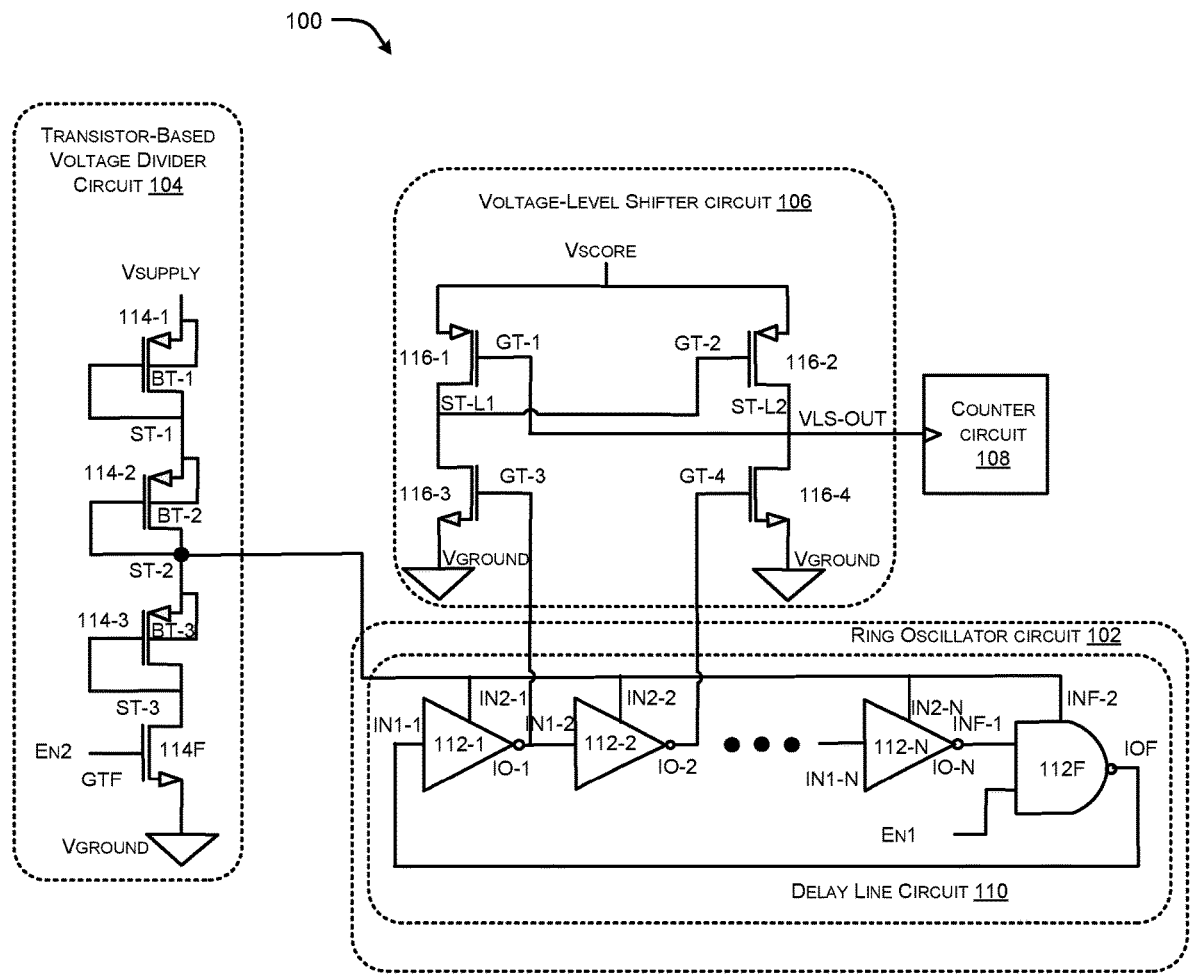
FIG. 1 illustrates an exemplary circuit diagram representation of a voltage monitoring system, according to an example embodiment of the present disclosure.

FIG. 1 illustrates an exemplary circuit diagram representation of a voltage monitoring system 100, according to an example embodiment of the present disclosure. According to FIG. 1, the voltage monitoring system 100 may include a ring oscillator circuit 102, a transistor-based voltage divider circuit 104, a voltage-level shifter circuit 106, and a counter circuit 108. Further, the ring oscillator circuit 102 includes a delay line circuit 110. The voltage monitoring system 100 may be implemented by way of a single device or a combination of multiple devices that may be operatively connected or networked together. The voltage monitoring system 100 may be implemented in hardware or a suitable combination of hardware and software. The "hardware" may include a combination of discrete components, an integrated circuit, an application-specific integrated circuit, a field-programmable gate array, a digital signal processor, or other suitable hardware. The "software" may include one or more objects, agents, threads, lines of code, subroutines, separate software applications, two or more lines of code, or other suitable software structures operating in one or more software applications or on one or more processors.

For example, the voltage monitoring system 100 may be used in wireless sensor networks for environmental monitoring, industrial automation, smart buildings, and agriculture. The harvested energy may be used to power sensors, eliminating need for batteries or wired connections. Further, the voltage monitoring system 100 may be used in wearable devices, such as smartwatches, fitness trackers, and medical devices. The harvested energy from body movements, solar power, or thermal gradients may be used to charge the devices or extend their battery life. Furthermore, the voltage monitoring system 100 may be used in an internet of things (IoT) for providing sustainable power for IoT devices deployed in remote or inaccessible locations. This enables the deployment of IoT networks without the need for frequent battery replacement or reliance on grid power. Additionally, the voltage monitoring system 100 may be used in environmental monitoring scenarios where energy harvesting systems may power autonomous environmental monitoring systems, including weather stations, air quality sensors, and water quality sensors. The autonomous environmental monitoring systems may derive energy from solar, wind, or vibration sources, enabling long-term, and self-sustaining monitoring in remote areas.

Further, the voltage monitoring system 100 may be used in smart buildings to power wireless switches, occupancy sensors, and other building automation systems. The harvested energy from ambient light, motion, or temperature differences may reduce the reliance on grid power and contribute to energy efficiency. Also, the voltage monitoring system 100 may be used in transportation applications such as automobiles, trains, and airplanes. The kinetic energy generated during motion or vibrations may be harvested and used to power various onboard systems, reducing the dependence on fossil fuels, and improving energy efficiency. Further, the voltage monitoring system 100 may be used in industrial applications such as powering wireless sensors, monitoring equipment, and automation systems in factories or industrial plants. The voltage monitoring system 100 eliminates the need for complex wiring and maintenance of batteries. Furthermore, the voltage monitoring system 100 may be used in remote monitoring and tracking, such as wildlife tracking, asset tracking, or logistics management. The harvested energy may power the tracking devices, eliminating the need for frequent battery replacements.

Furthermore, the voltage monitoring system 100 may be used in human-powered devices that rely on human interaction, such as self-powered watches, flashlights, or radios. The voltage monitoring system 100 may harness the mechanical energy from human movements to generate electricity and eliminate the need for disposable batteries. The voltage monitoring system 100 may be used in agriculture and farming for applications such as autonomous irrigation systems, soil monitoring, or livestock tracking. Solar energy, wind energy, or vibrations from machinery may be utilized to power these voltage monitoring system(s) 100. The voltage monitoring system 100 may be used in the defense sector such as equipment used by soldiers, such as backpacks, helmets, or clothing, to harvest energy from their body movements. This harvested energy may be used to power various electronics carried by the soldiers, including communication devices, global positioning system (GPS), night vision goggles, or wearable sensors. Further, the voltage monitoring system 100 may be used in unmanned systems, such as drones or unmanned ground vehicles (UGVs). Also, the voltage monitoring system 100 may be used in remote sensors and surveillance, communication and networking, perimeter security, underwater systems, battlefield electronics, and electronic warfare.

Though few components and subsystems are disclosed in FIG. 1, there may be additional components and subsystems which is not shown, such as, but not limited to, ports, routers, repeaters, firewall devices, network devices, databases, network attached storage devices, servers, assets, machineries, instruments, facility equipment, emergency management devices, image capturing devices, any other devices, and combination thereof. The person skilled in the art should not be limiting the components/subsystems shown in FIG. 1. Although FIG. 1 illustrates the ring oscillator circuit 102, is connected to the transistor-based voltage divider circuit 104, the voltage-level shifter circuit 106, one skilled in the art may envision that the ring oscillator circuit 102, may be connected to several transistor-based voltage divider circuits, voltage-level shifter circuits located at same/different locations. Further, although FIG. 1 illustrates the voltage-level shifter circuit 106 connected to the counter circuit 108, one skilled in the art may envision that the voltage-level shifter circuit 106 may be connected to several counter circuits located at same/different locations.

Those of ordinary skilled in the art will appreciate that the hardware depicted in FIG. 1 may vary for particular implementations. For example, other peripheral devices such as an optical disk drive and the like, local area network (LAN), wide area network (WAN), wireless (e.g., wireless-fidelity (Wi-Fi)) adapter, graphics adapter, disk controller, input/output (I/O) adapter also may be used in addition or place of the hardware depicted. The depicted example is provided for explanation only and is not meant to imply architectural limitations concerning the present disclosure.

Those skilled in the art will recognize that, for simplicity and clarity, the full structure and operation of all data processing systems suitable for use with the present disclosure are not being depicted or described herein. Instead, only so much of the voltage monitoring system 100 as is unique to the present disclosure or necessary for an understanding of the present disclosure is depicted and described. The remainder of the construction and operation of the voltage monitoring system 100 may conform to any of the various current implementations and practices that were known in the art.

In an exemplary embodiment, the voltage monitoring system 100 may execute the ring oscillator circuit 102 including the delay line circuit 110. In an exemplary embodiment, the delay line circuit 110 may include a series of inverting logic gates 112-1, 112-2, ..., 112-N (hereinafter referred to as Inverting logic gate(s) 112'). Each of the inverting logic gates 112 may include a first input terminal IN1-1, IN1-2, ..., IN1-N (hereinafter referred to as the first input terminal IN1), and a second input terminal IN2-1, IN2-2, ..., IN2-N (hereinafter referred to as the second input terminal IN2). Further, the inverting logic gate 112 may include an intermediate output terminal IO-1, IO-2, ..., IO-N (hereinafter referred to as the intermediate output terminal 10). Further, the series of inverting logic gates 112 includes a final inverting logic gate 112F. The final inverting logic gate 112F may include a first input terminal INF-1, a second input terminal INF-2, an enable input terminal EN1, and a final output terminal IOF. The final output terminal IOF of the final inverting logic gate 112F may be looped to the first input terminal IN1-1 of a first inverting logic gate 112-1 to form a self-oscillating feedback loop as shown in FIG. 1.

In an exemplary embodiment, the ring oscillator circuit 102 may include an odd-numbered series of inverting logic gates 112 to generate a ring oscillator frequency which is inversely proportional to a supply voltage $V_{supply}$. In an exemplary embodiment, the ring oscillator circuit 102 may measure a change in the ring oscillator frequency. When the change in the ring oscillator frequency is higher, enable period of the ring oscillator circuit 102 is decreased for operating the voltage monitoring system 100 at one of a lower duty cycle and at a higher sampling rate. The enable period may correspond to the amount of time the ring oscillator circuit 102 is powered to generate at least one sample and the sampling rate corresponds to a time between a distinct sample. In an example, the ring oscillator circuit 102 may include a rate of oscillation depending on a propagation delay of the inverting logic gates 112. Further, the propagation delay in the ring oscillator circuit 102 may be based on the supply voltage $V_{supply}$ of the voltage monitoring system 100. In an exemplary embodiment, the ring oscillator circuit 102 may include a voltage sensitivity which may increase based on a chain length of the series of inverting logic gates 112. In an exemplary embodiment, the ring oscillator circuit 102 may be operated at a low voltage level to maximize linearity of a voltage-frequency transfer function.

In an exemplary embodiment, the voltage monitoring system 100 may execute the transistor-based voltage divider circuit 104 connected to the ring oscillator circuit 102 via the second input terminal IN2 of the inverting logic gates 112 and 112F. Further, the transistor-based voltage divider circuit 104 may include a plurality of diode connected transistor devices 114-1, 114-2, 114-3 (hereinafter referred to as the diode connected transistor device(s) 114) with each bulk terminal BT-1, BT-2, BT-3 of the diode connected transistor device 114 connected to each source terminal ST-1, ST-2, ST-3 of the diode connected transistor device 114. Furthermore, the plurality of diode connected transistor devices 114 may include a final diode connected transistor device 114F fed with an enable signal EN2 at a gate terminal GTF of the final diode connected transistor device 114F. A first diode connected transistor device 114-1 is supplied with $V_{supply}$, and the final diode connected transistor device 114F is connected to $V_{ground}$.

In an exemplary embodiment, the ring oscillator circuit 102 may generate the ring oscillator frequency as a function of change in the supply voltage. The ring oscillator frequency may be dependent on an average gate delay of the inverting logic gates 112. Further, the average gate delay may be directly proportional to at least one of a change in the size of a diode connected transistor device 114 and the supply voltage $V_{supply}$.

In an exemplary embodiment, the ring oscillator circuit 102 may generate an output voltage level. The output voltage level of the ring oscillator circuit 102 may be lesser than an output voltage level of the transistor-based voltage divider circuit 104. Furthermore, the output voltage level of the transistor-based voltage divider circuit 104 may be a fractional value of the supply voltage. Further, the ring oscillator circuit 102 may extract power from the transistor-based voltage divider circuit 104 resulting in a voltage drop below a nominal voltage value. Furthermore, the voltage drop may be rectified by increasing width of the plurality of diode connected transistor devices 114 of the transistor-based voltage divider circuit 104.

In an exemplary embodiment, the transistor-based voltage divider circuit 104 may set an operating range for the ring oscillator circuit 102 to tune the ring oscillator circuit 102 to operate in a preferred voltage region. The enable signal EN2 fed to the gate terminal GTF of the final diode connected transistor device 114F may change the duty cycle of the ring oscillator circuit 102. The preferred voltage region may be determined based on a type of the inverting logic gates 112 and an operating voltage of the ring oscillator circuit 102.

In an exemplary embodiment, the voltage monitoring system 100 may execute the voltage-level shifter circuit 106 connected to the ring oscillator circuit 102 via the intermediate output terminal 10 of the inverting logic gates 112. The voltage-level shifter circuit 106 may include a plurality of transistors 116-1, 116-2, 116-3, and 116-4 (hereinafter referred to as transistor 116). The transistors 116-1 and 116-2 may be supplied with $V_{score}$ and the transistors 116-3 and 116-4 may be connected to $V_{ground}$. Further, gate terminals GT-1, GT-2 of the transistors 116-1 and 116-2 may be connected to source terminals ST-L2 and ST-L1 of the transistors 116-2 and 116-1, respectively. The gate terminals GT-3, GT-4 of the transistors 116-3 and 116-4 may be connected to the ring oscillator circuit 102 via the intermediate output terminal 10 of the inverting logic gates 112. The voltage-level shifter circuit 106 may include an output terminal VLS-OUT from the transistors 116-2 and 116-4. In an exemplary embodiment, the voltage-level shifter circuit 106 may receive an intermediate output signal from the intermediate output terminals 10 of the inverting logic gates 112. The intermediate output signal may include the output voltage level.

In an exemplary embodiment, the voltage monitoring system 100 may execute the counter circuit 108. The counter circuit 108 may be connected to the voltage-level shifter circuit 106 via the output terminal VLS-OUT of the voltage-level shifter circuit 106. Further, the counter circuit 108 may be connected to an external system for harvesting energy to perform a computational task. For example, the external system(s) may include, but are not limited to, intermittent computation circuits, processors, energy harvesting systems, internet of things (IoT) systems, wearable medical systems, remote sensing and monitoring systems, smart grid and energy management systems, environmental and structural health monitoring systems, intelligent transportation systems, smart city systems, industrial automation and monitoring systems, disaster management systems, agricultural monitoring and precision farming, defense systems, any other systems, and a combination thereof.

In an exemplary embodiment, the counter circuit 108 may generate a count value based on the ring oscillator frequency and a time per sample during which the voltage monitoring system 100 is enabled. The count value corresponds to a number of times an output signal IOF from the final inverting logic gate 112F traverses the self-oscillating feedback loop of the ring oscillator circuit 102 during a fixed time period. Further, the count value may indicate an available energy level in a buffer capacitor. Furthermore, the count value may be transmitted to a digital comparator (not shown in FIG. 1) for generating an interrupt signal and a request for determining available energy level in the buffer capacitor to perform the computational task.

In an exemplary embodiment, the voltage monitoring system 100 may determine voltage difference between the output voltage level and a voltage level $V_{score}$ required by an intermittent computation circuit (not shown in FIG. 1). Further, the voltage monitoring system 100 may generate a level-shifted output signal based on the determined voltage difference by shifting the output voltage level to the voltage level $V_{score}$ required by the intermittent computation circuit. The level-shifted output signal may include the voltage level $V_{score}$ required by the intermittent computation circuit. The output voltage level is shifted to the voltage level $V_{score}$ required by the intermittent computation circuit using a common ground of the transistor-based voltage divider circuit 104, and the voltage-level shifter circuit 106 to boost the output voltage.

Figure 2:
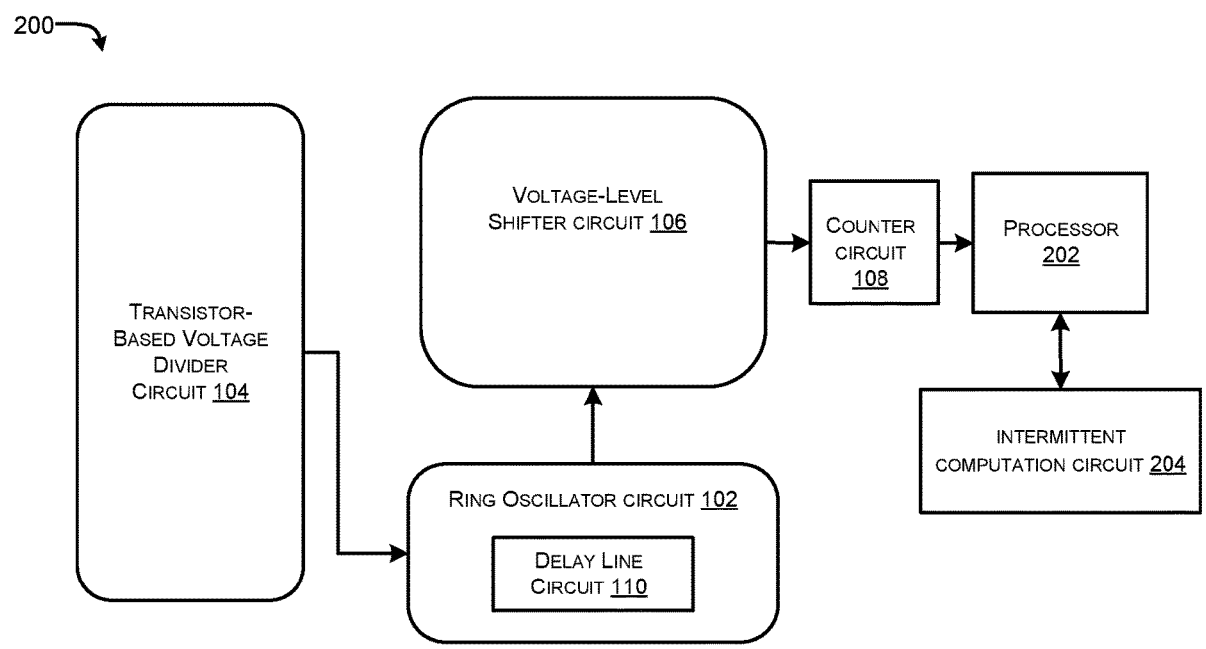
FIG. 2 illustrates an exemplary block diagram representation of a system for harvesting energy using a digital voltage monitoring system, such as those shown in FIG. 1, according to an example embodiment of the present disclosure.

FIG. 2 illustrates an exemplary block diagram representation of a system for harvesting energy using a digital voltage monitoring system 200, such as those shown in FIG. 1, according to an example embodiment of the present disclosure. The digital voltage monitoring system 200 may include the ring oscillator circuit 102 with the delay line circuit 110, the transistor-based voltage divider circuit 104, the voltage-level shifter circuit 106, the counter circuit 108, a hardware processor 202, and an intermittent computation circuit 204.

The hardware processor(s) 202 may be coupled to a memory (not shown in FIGs.) The memory may include a plurality of modules/subsystems. The digital voltage monitoring system 200 may be a hardware device including the hardware processor 202 executing machine-readable program instructions for intermittent computation via low-cost hardware support to harvest energy using voltage monitoring systems. Execution of the machine-readable program instructions by the hardware processor 202 may enable the digital voltage monitoring system 200 to intermittently compute via low-cost hardware support to harvest energy using the digital voltage monitoring systems 200. The "hardware" may comprise a combination of discrete components, an integrated circuit, an application-specific integrated circuit, a field-programmable gate array, a digital signal processor, or other suitable hardware. The "software" may comprise one or more objects, agents, threads, lines of code, subroutines, separate software applications, two or more lines of code, or other suitable software structures operating in one or more software applications or on one or more processors.

The hardware processor(s) 202 may include, but are not limited to, microprocessors, microcomputers, microcontrollers, digital signal processors, central processing units, state machines, logic circuits, and/or any devices that manipulate data or signals based on operational instructions, and the like. Among other capabilities, hardware processor 202 may fetch and execute computer-readable instructions in the memory operationally coupled with the digital voltage monitoring system 200 for performing tasks such as data processing, input/output processing, and/or any other functions. Any reference to a task in the present disclosure may refer to an operation being or that may be performed on data.

In an example, any ring oscillator circuit may correctly operate at a wide range of voltages using well-chosen clock frequency guard bands, which hide the extreme sensitivity of the underlying circuits to voltage changes. Removing the clock frequency guard bands from an otherwise digital circuit may reveal analog-domain latency changes, which in turn reveal output voltage of the digital voltage monitoring system 200 or the system 100. The digital voltage monitoring system 200 may remove the clock frequency guard bands, by measuring the propagation of a signal through lines of digital delay elements of the delay line circuit 110 to support dynamic voltage and the frequency scaling. However, a narrow voltage range of the digital voltage monitoring system 200, beyond which input either propagates entirely or does not propagate may enable the digital voltage monitoring system 200 ill-matched for the voltage monitoring required by the intermittent computation circuit(s) 204.

In an exemplary embodiment, the delay line of the delay line circuit 110 may receive input at the first input terminal IN1 and second input terminal IN2, and provide output from the final output terminal IOF, as shown in FIG. 1. Such an arrangement ensures that the output IOF of the delay line circuit 110 changes each time the output IOF passes through the entire delay line (i.e., it is self-oscillating) to function as the ring oscillator circuit 102. The ring oscillator circuit 102 may provide an output frequency that may be primarily a function of supply voltage $V_{supply}$ and a dynamic range covering nearly the entire voltage at which the ring oscillator circuit 102 oscillates. The voltage-dependent nature of the output frequency from the ring oscillator circuit 102 may be used to measure available energy level. In an embodiment, the ring oscillator circuit 102 may include an odd-numbered ring of the series of inverting logic gates 112, as shown in FIG. 1. The odd-numbered chain of the series of inverting logic gates 112 may provide an output which is an inverse of the input. Hence, the input of the odd-numbered chain of the series of inverting logic gates 112 may be fed with the output to function as a circuit that oscillates as long as power is supplied. The length of the ring oscillator circuit 102 may be application-dependent and may be typically of prime importance to reduce potential harmonic oscillations. The frequency of oscillation depends on the length 'n' of the chain and the gate delay of each of the series of inverting logic gates 112 '$\tau_d$' as shown in equation 1 below:

$$f_0 = \frac{1}{2n\tau_d} \qquad \text{Equation 1}$$

In the above equation 1, the variable '$\tau_d$' may refer to a gate delay on the oscillation frequency '$f_0$', and a variable 'n' may be a length of the ring oscillator circuit 102.

With a constant chain length, a variable 'R' corresponding to the ring oscillator circuit 102 may output the frequency which is entirely dependent on an average gate delay of the series of inverting logic gates 112. Several factors may affect the gate delay, for example, the transistor size or supply voltage $V_{supply}$, temperature and manufacturing variations of the series of inverting logic gates 112 or the digital voltage monitoring system 200. Among these, voltage may be the dominant factor. Further, to characterize the effect of the supply voltage $V_{supply}$ on the output frequency, for example, a circuit designer may implement a comprehensive set of simulations. The comprehensive set of simulations may be implemented on different ring oscillator circuit (also referred as 'ring oscillator circuit 102 through the disclosure) of varying lengths, operating at a range of supply voltages using the predictive technology models for the 130 nm, 90 nm, and 65 nm technology nodes. The feature sizes may be chosen as a representative of the technology currently used on energy harvesting platforms as well as the logical next feature size for future systems. The circuit designer may sweep the supply voltages from 0.2 V (below which the rings do not oscillate) in 100 mV steps up to 3.6 V, which is the maximum supply voltage for a typical energy-harvesting-class devices.

In an exemplary embodiment, the hardware processor 202 may be connected to the counter circuit 108 via an output terminal VLS-OUT of the counter circuit 108. Further, the intermittent computation circuit 204 may be connected to the hardware processor 202 via an input terminal of the intermittent computation circuit 204. In an exemplary embodiment, the hardware processor 202 may monitor a buffer capacitor voltage for the intermittent computation circuit 204. The buffer capacitor voltage may be monitored by mapping the counter values from the counter circuit 108 to values of a pre-defined supply voltage.

In an exemplary embodiment, the intermittent computation circuit 204 may be a standalone circuit used for intermittent computation purposes. Further, the intermittent computation circuit 204 may be a small and a low-power computing device used across a plurality of application domains. The plurality of application domains may include, but are not limited to, internet of things (IoT) devices, wearable/implantable/ingestible medical sensors, infrastructure monitors, and small satellites, supply chain monitoring devices, deep water devices, safety monitoring, structural integrity monitoring devices, any other devices, and combinations thereof. Further, the intermittent computation circuit 204 may harvest and buffer energy as is available and operate when sufficient energy is banked or stored.

In an exemplary embodiment, operations in intermittent computation circuit 204 may be intermittent because energy may not be always available to harvest. Though energy is available, buffering enough energy to perform a useful amount of work may require time. The hardware of the intermittent computation circuit 204 may include general-purpose computing components, such as a central processing unit (CPU) or microcontroller unit (MCU), an array of sensors, and one or more radios for communication. Typical devices may include a volatile memory that loses its state on a power failure, such as a static random-access memory (SRAM) and a dynamic RAM (DRAM), and a non-volatile memory that retains its state on a power failure, such as a flash memory, a ferroelectric RAM (FRAM), and the like.

In particular, software in intermittent computation circuit 204 may execute until energy may be depleted. When energy is again available, the software resumes execution from some point in the history of its execution. As may be understood by those skilled in the art, the key distinction between a conventional execution and intermittent execution is that a conventionally executing program is assumed to run to completion, however, intermittent execution may span a plurality of power failures. To withstand power failures that occur for a plurality of times per second, multiple layers of a given system require an intermittent-aware design, including languages, runtimes, and application logic.

Figure 3A:
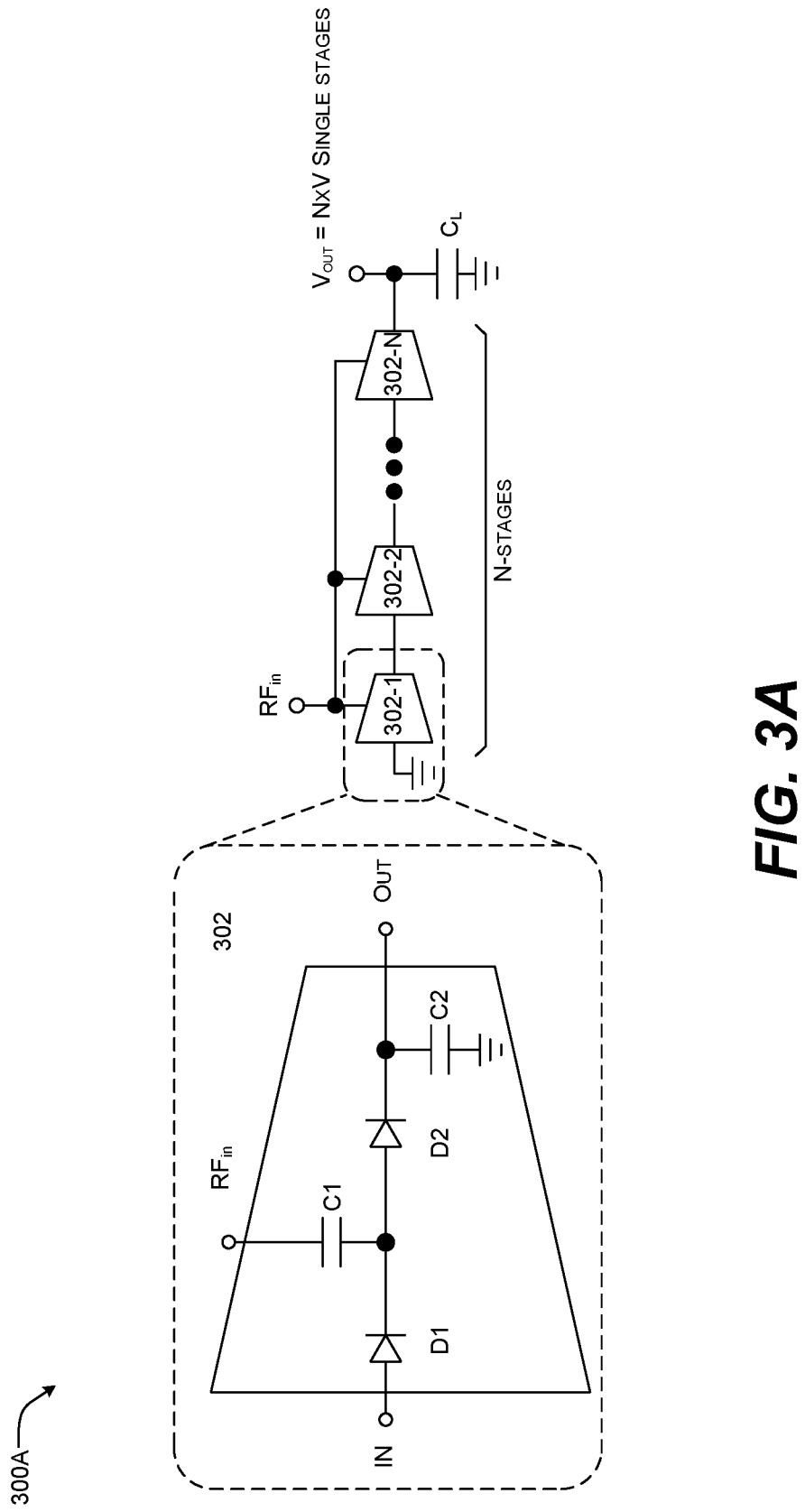
FIG. 3A illustrates an exemplary circuit diagram representation of a millimeter (mm) wave energy harvesting circuit, according to an example embodiment of the present disclosure.

FIG. 3A illustrates an exemplary circuit diagram representation of a millimeter (mm) wave energy harvesting circuit 300A, according to an example embodiment of the present disclosure. The mm-wave energy harvesting circuit 300A includes a series of connection of voltage rectifier circuits 302, 302-1, 302-2, . . . , 302-N (N-stages) (herein after referred to as the rectifier circuit(s) 302). The rectifier circuit 302 may convert alternating current (AC) signals received by an antenna into direct current (DC) signals. Each of the rectifier circuits 302 may include diodes D1, D2, . . . , DN and capacitors C1, C2, . . . , CN. The diodes D1, D2, DN may allow current flow in one direction, and the capacitors C1, C2, . . . , CN may smooth out the rectified waveform. The rectifier circuit 302 ensures that the harvested energy is converted into a usable form.

The mm-wave energy harvesting circuit 300A may require consideration of a plurality of factors, resulting in high efficiency at the cost of circuit complexity. The plurality of factors may include, but are not limited to, a wideband and multiband, a wide range of input power, a power combining for phased-array applications, an impact of the components parasitic, an increase of the substrate loss, and the like.

Figure 3B:
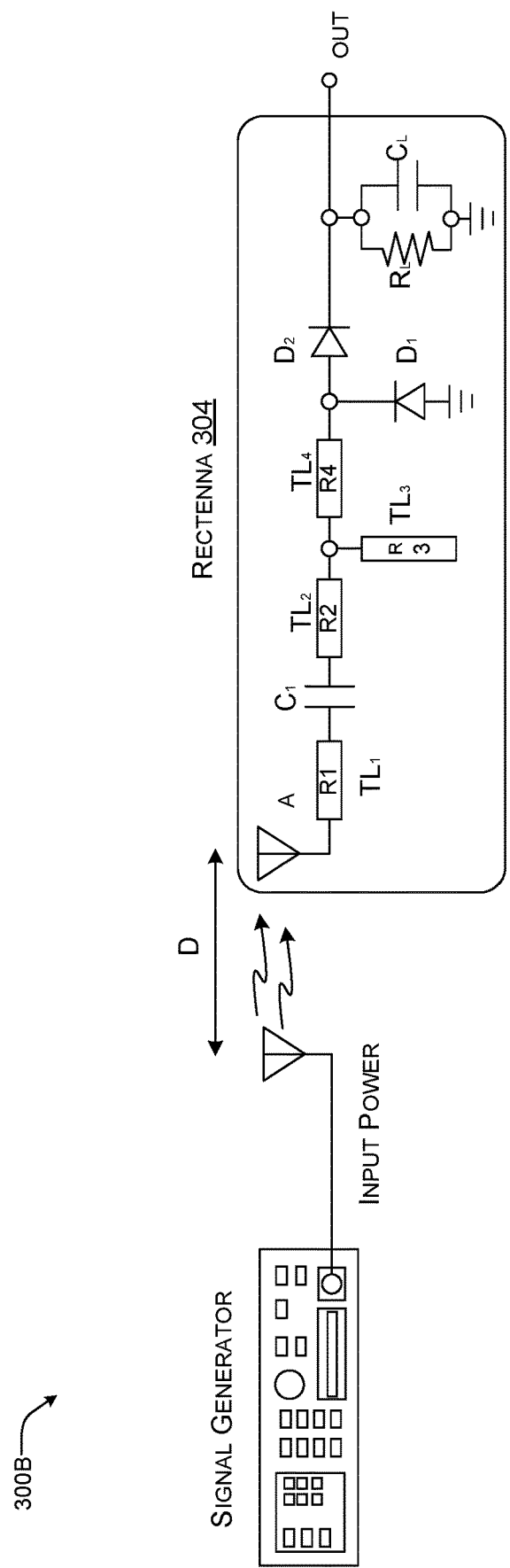
FIG. 3B illustrates an exemplary circuit diagram representation of a rectenna and a test setup, according to an example embodiment of the present disclosure.

FIG. 3B illustrates an exemplary circuit diagram representation of a rectenna 304 and a test setup 300B, according to an example embodiment of the present disclosure. The rectenna 304, which is composed of a rectifier R1, R2, R3, R4 and an antenna A, may be used to harvest energy from a for example, sub-6 GHz frequency band with a center frequency of for example, 2.655 GHz and a bandwidth of 70 MHz. The target frequency range covers a downlink operating band of a long-term evolution for machines (LTE-M), a LTE narrow band internet of things (LTE-NB-IoT), fifth generation NB-IoT (5G NB-IoT) communication standards, sixth generation (6G) communication standards, open radio access network (O-RAN) communication standards, and the like.

Figure 3C:
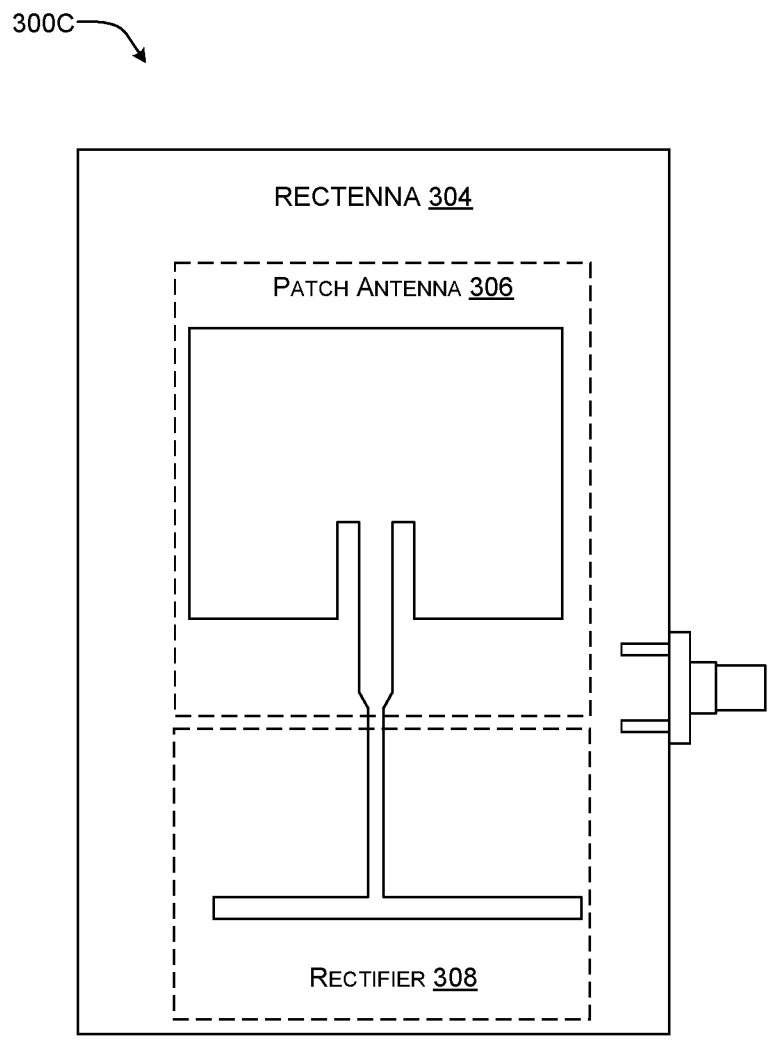
FIG. 3C illustrates an exemplary block diagram representation of a prototype of a rectenna, according to an example embodiment of the present disclosure.

FIG. 3C illustrates an exemplary block diagram representation of a prototype 300C of the rectenna 304, according to an example embodiment of the present disclosure. The rectenna 304 may include a patch antenna 306 and a rectifier 308. The size of a printed circuit board (PCB) may be, for example, 8 mm×6 mm. The width of the transmission lines in the rectenna 304 may be, for example, 2 mm. The patch antenna 306 may be implemented along with the rectifier 308 to operate as a receiver. The patch antenna 306 may eliminate the need for an external antenna. Exemplary values of circuit components of the rectenna 304 are shown in Table 1 below.

TABLE 1

| | | | Parts | | | |
|---|---|---|---|---|---|---|
| $TL_1$ | $TL_2$ | $TL_3$ | $TL_4$ | $C_1, C_L$ | $D_{1,2}$ | $R_L$ |
| Value/ 12.2 | 5 | 11.8 | 9.8 | 10 | Skyworks | 5.8 |
| Model mm | mm | mm | mm | pF | SMS7630 | KΩ |

Further, in the rectenna 304, key performance of a radio frequency (RF) energy harvesting may be a power conversion efficiency (PCE). The PCE may be calculated as shown in equation 2 below:

$$PCE (\%) = \frac{Output\ DC\ power}{Incident\ RF\ power} \times 100 \qquad Equation\ 2$$

In the above equation 2, the variable PCE may refer to a ratio of a direct current (DC) power at the load converted from an incident RF power. The measurements may be conducted in an anechoic chamber to minimize the reflections and interferences in the environment.

Figure 3D:
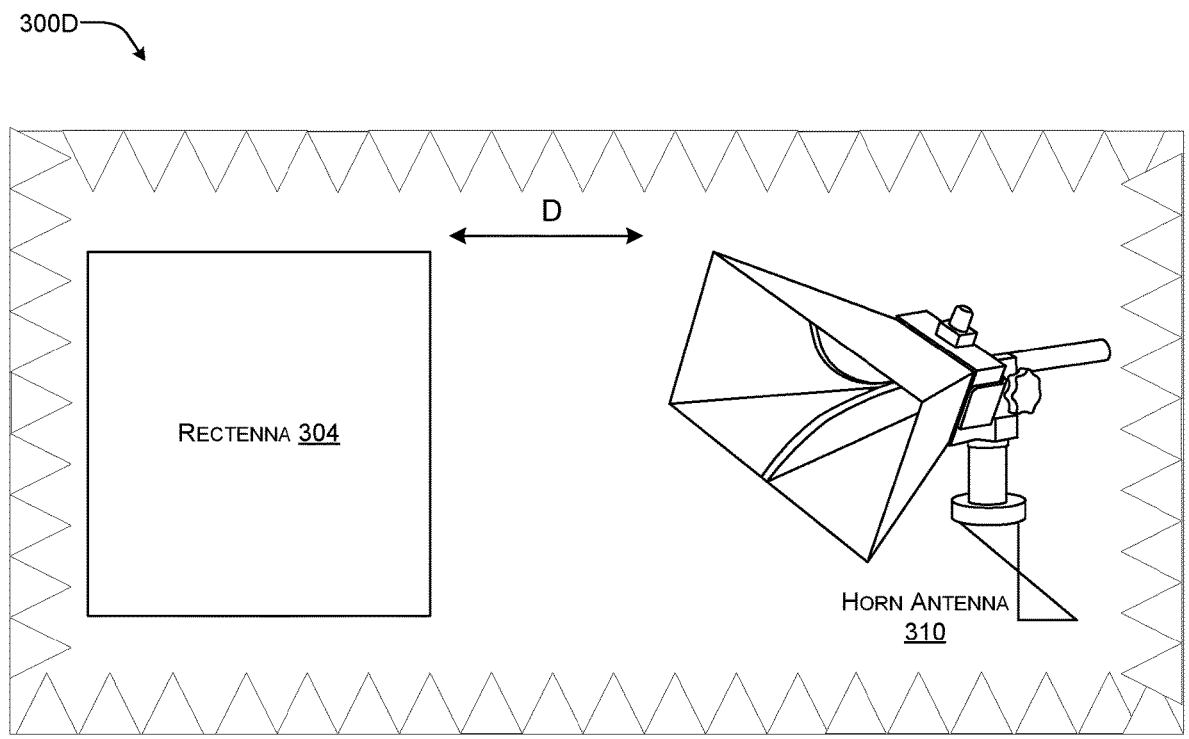
FIG. 3D illustrates an exemplary schematic diagram representation of a measurement setup for a rectenna, according to an example embodiment of the present disclosure.

FIG. 3D illustrates an exemplary schematic diagram representation of a measurement setup 300D for the rectenna 304, according to an example embodiment of the present disclosure. A horn antenna 310 may be implemented as a transmitting antenna connected to a signal generator (not shown in FIG. 3D). The transmitter and the rectenna 304 may be, for example, 40 cm apart to achieve accuracy, while the rectenna 304 receives power from far-field waves propagated by the transmitter. The measured center frequency of the prototype may be, for example, 2630 MHz, which is lower than the simulated frequency of, for example, 2655 MHz by 25 MHz. The center frequency may be tuned by adjusting the size of the horn antenna 310.

Figure 4A:
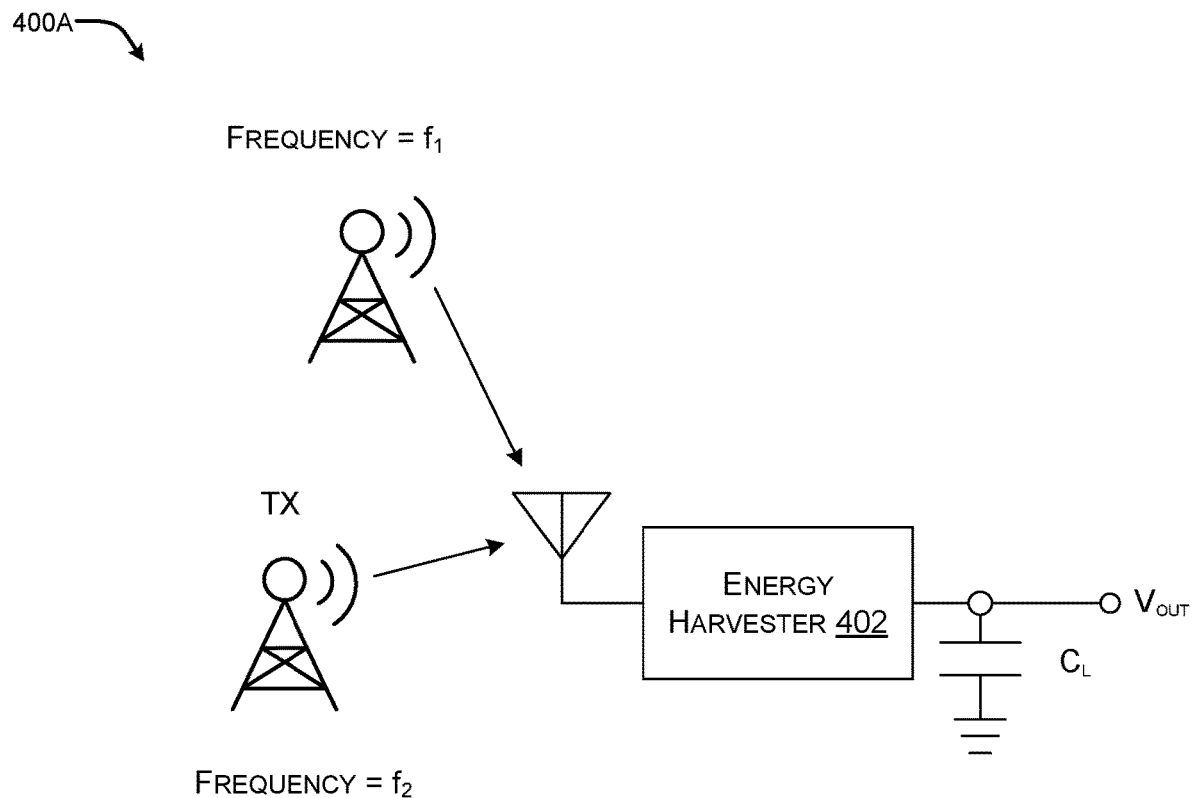
FIG. 4A illustrates an exemplary circuit diagram representation of a multi-band energy harvester system, according to an example embodiment of the present disclosure.

FIG. 4A illustrates an exemplary circuit diagram representation of a multi-band energy harvester system 400A, according to an example embodiment of the present disclosure. The multi-band energy harvester system 400A may include a plurality of antennas, and an energy harvester 402. The energy harvester 402 may harvest energy from multi frequency bands instead of a single band. Harvesting energy from multi frequency bands may increase the available power at the receiver input and in turn direct current (DC) power at the output. Each antenna of the plurality of antennas may be optimized for a specific frequency band (f1, f2). The plurality of antennas may be designed to efficiently capture electromagnetic energy from different bands. The plurality of antennas may be physically separated or integrated into a single structure, depending on the specific system requirements.

Further, the energy harvester 402 may include rectifiers (not shown in FIG. 4A) that are specifically designed to work with the different frequency bands being targeted. Each rectifier may be optimized for a particular frequency range to ensure efficient conversion of the captured alternating current (AC) signals into usable DC power. These rectifiers may have different topologies, such as voltage doubler, full-wave rectifier, or synchronous rectifier, depending on the specific frequency band characteristics and power requirements. Furthermore, the harvested energy may be utilized to power electronic devices directly or stored in batteries or energy storage systems for later use. Depending on the specific application, the multi-band energy harvester system 400A may distribute the power among different loads or store the power in a centralized energy storage unit, allowing for flexible energy utilization.

Figure 4B:
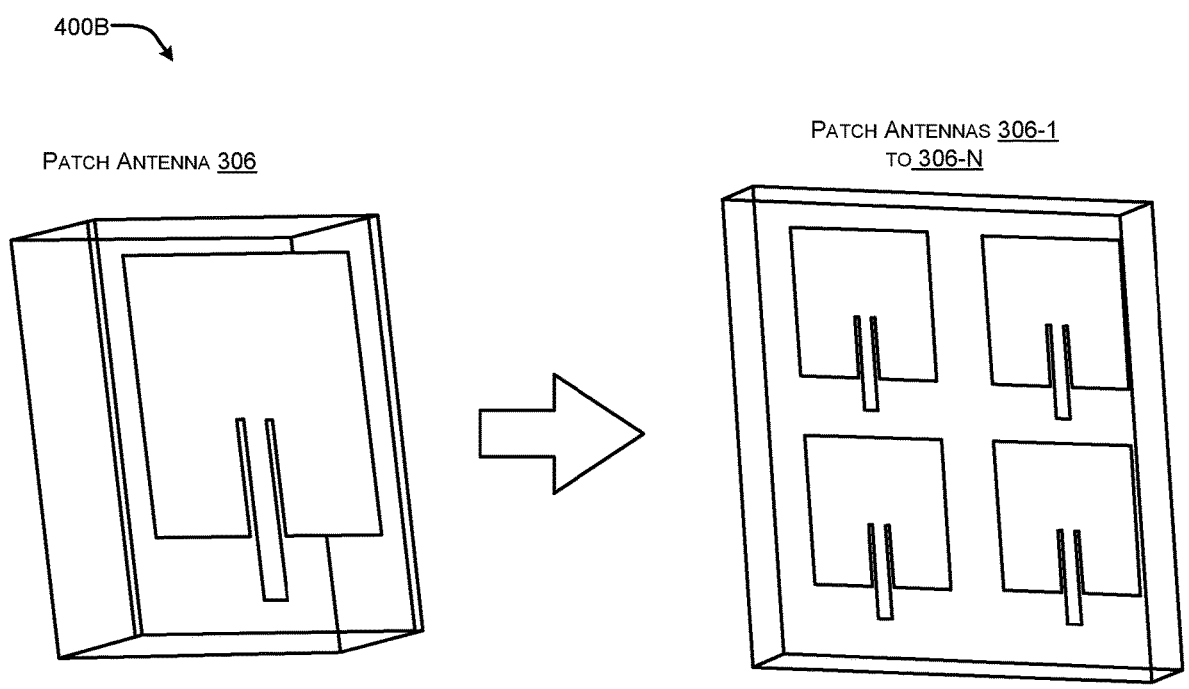
FIG. 4B illustrates an exemplary schematic diagram representation of an array of antennas, according to an example embodiment of the present disclosure.

FIG. 4B illustrates an exemplary schematic diagram representation of an array of antennas 400B, according to an example embodiment of the present disclosure. The array of antennas 400B includes array of patch antennas 306-1, 306-2, . . . , 306-N. The array of patch antennas 306-1, 306-2, . . . , 306-N may refer to a configuration where multiple patch antennas are arranged together in a specific pattern or array. The array of patch antennas 306-1, 306-2, . . . , 306-N may increase the received input power ideally by a number of patch antennas in the array compared with a single of monolithic patch antenna 306. The configuration of the array of patch antennas 306-1, 306-2, . . . , 306-N may offer distinct advantages over a single patch antenna 306 in terms of radiation characteristics, beam steering capabilities, spatial diversity, size and form factor, increased gain, increased bandwidth, and improved system performance.

Figure 4C:
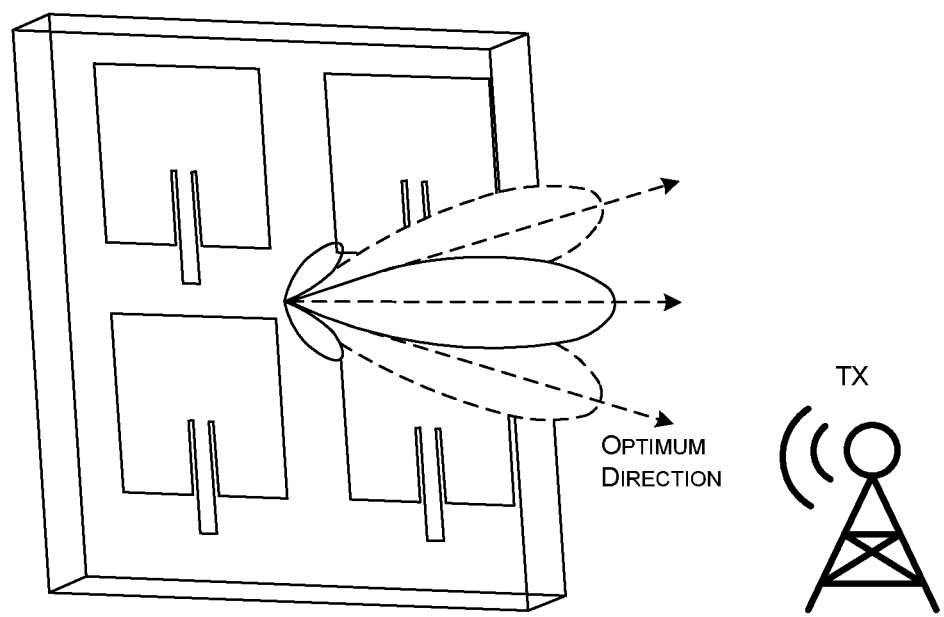
FIG. 4C illustrates an exemplary schematic diagram representation of an antenna beam forming, according to an example embodiment of the present disclosure.

FIG. 4C illustrates an exemplary schematic diagram representation of an antenna beam forming 400C, according to an example embodiment of the present disclosure. The array of patch antennas 306-1, 306-2, . . . , 306-N may be used for beamforming, which is a technique to steer and shape the radiation pattern of the antenna to focus the transmitted or received signals in a specific direction. The antenna beam forming 400C steers the radiation pattern of the antenna to maximize received power. Beamforming allows for improved signal strength, coverage, and interference rejection. The beamforming may be achieved using the array of patch antennas 306-1, 306-2, . . . , 306-N, using, but not limited to, a single-element beamforming, an array-based beamforming, a digital or analog beamforming, and the like. In the array-based beamforming, a beam steering is performed by controlling the phase and amplitude of the signals applied to each element. The array may steer the main lobe of the radiation pattern in a desired direction. By adjusting the phase of each element, the array may achieve a phase difference that causes the constructive interference of the signals in a specific direction, resulting in a focused beam. Further, in the array-based beamforming, a beam shaping may be in addition to steering, beamforming allows for shaping the radiation pattern. By adjusting the amplitude and phase distribution across the array, the shape and characteristics of the main lobe and side lobes may be tailored to meet specific requirements. This may help in achieving desired coverage, signal strength, and interference rejection.

Beamforming using the array of patch antennas 306-1, 306-2, . . . , 306-N may be applied in various applications, such as wireless communication systems, radar systems, and satellite communication. The array enables directional communication, improves link quality, and enhances system performance in challenging environments. The specific implementation of beamforming with patch antennas depends on the requirements of the application and desired beamforming capabilities.

Figure 5B:
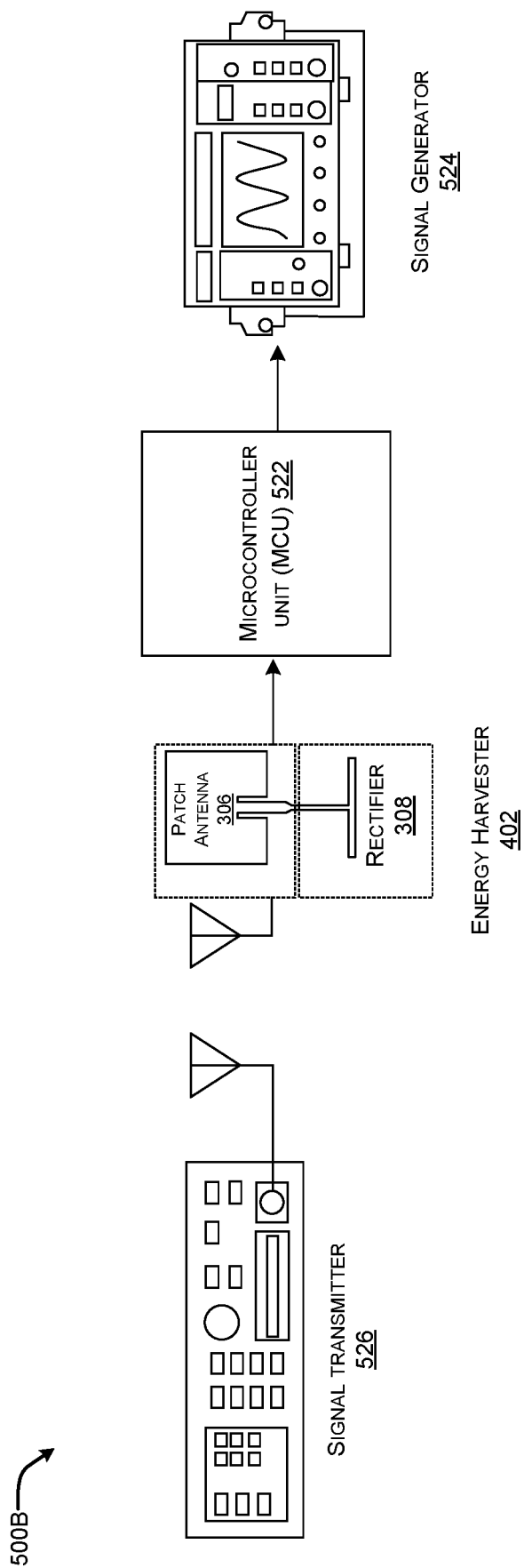

Exemplary Scenario 1:

FIGS. 5A and 5B illustrate block diagram and circuit diagram representations of a combination of fifth generation (5G) energy harvester 502 with intermittent computation circuit, and a combination of an energy harvester 402 with a microcontroller unit (MCU) 522 that implements an intermittent computation, respectively, according to an example embodiment of the present disclosure. FIG. 5A illustrates the combination of the fifth generation (5G) energy harvester 502 with intermittent computation circuit 500A. In this combination, a 5G energy harvester 502 (task 1.1) may be integrated with a circuit that enables intermittent computation. The 5G energy harvester 502 captures and converts the radio frequency (RF) energy from 5G signals into electrical power. The harvested energy is then used to power a system that employs intermittent computation such as a harvesting support circuit 504 (task 1.2), a hardware security primitive circuit 506 (task 2.1), a 5G crypto circuit 508 (task 2.2), and a rooted in reduced instruction set computer (RISC) five (RISC-V) system on chip (SoC) 510. The 5G energy harvester 502 may be associated with one or more applications 512-1 to 512-N, and an operating system (OS) 514. The 5G energy harvester 502 may include an antenna for capturing RF signals, a rectifier for converting the RF signals into DC power, and a power management system for regulating and storing the harvested energy. The intermittent computation circuit is also included in the block diagram, allowing the intermittent operation of a microcontroller or other computing devices.

FIG. 5B illustrates a combination of an energy harvester 402 with a microcontroller unit (MCU) 522 that implements an intermittent computation. In this combination, the energy harvester 402, which may capture energy from sources such as a signal transmitter 526, is coupled with the microcontroller unit (MCU) 522 that implements intermittent computation. The harvested energy is used to power the MCU 522, which operates in a periodic or burst-like manner to conserve energy. The energy harvester 402 includes components such a patch antenna 306, rectifier 308, and energy storage devices (not shown). The harvested energy may be regulated and stored in the energy storage devices for powering the MCU 522. The output from the MCU 522 is shown in a signal generator 524.

Exemplary Scenario 2:

Usually, major design challenges for the 5G mm-wave energy harvesting may include, but are not limited to, a wideband and multiband, a wide range of input power, power combining for phased-array applications, an impact of the components parasitic, an increase of the substrate loss, and the like.

The above design challenges may be overcome by using a combination of fifth generation (5G) sub-sixth generation (6G), and millimeter (mm)-wave energy harvesting system 500a with intermittent computing to build sensing devices that are energy autonomous. For example, energy harvesting may not be enough to support high-frequency sensing and complex functions as the energy harvesting itself is intermittent and may not support continuous operations for extended periods. However, when combined with intermittent computing that allows for "checkpoints" of the computation, the same devices completing computations without the intermittent computing, were not possible.

The exemplary scenario herein may provide the energy harvesting component in combination with the intermittent computing. The exemplary scenario enables "parasitic computing" from harvested energy using multiple energy modalities such as an electromagnetic, a solar, piezoelectric, and the like. The potential use cases also include the ability to drop small devices in a large area and enable them to sense by drawing energy from the environment. This is especially useful in terrestrial environments, where the data networks have been disrupted. This includes areas that have been affected by a natural disaster, are contested, or lack network infrastructure. Further, the devices may be charged by satellite constellations that use 5G transmissions to "swipe" terrestrial areas. In such cases, the devices may be charged and be able to communicate without the need for any 5G base stations making the devices easily deployable in different use cases.

Figure 6A:
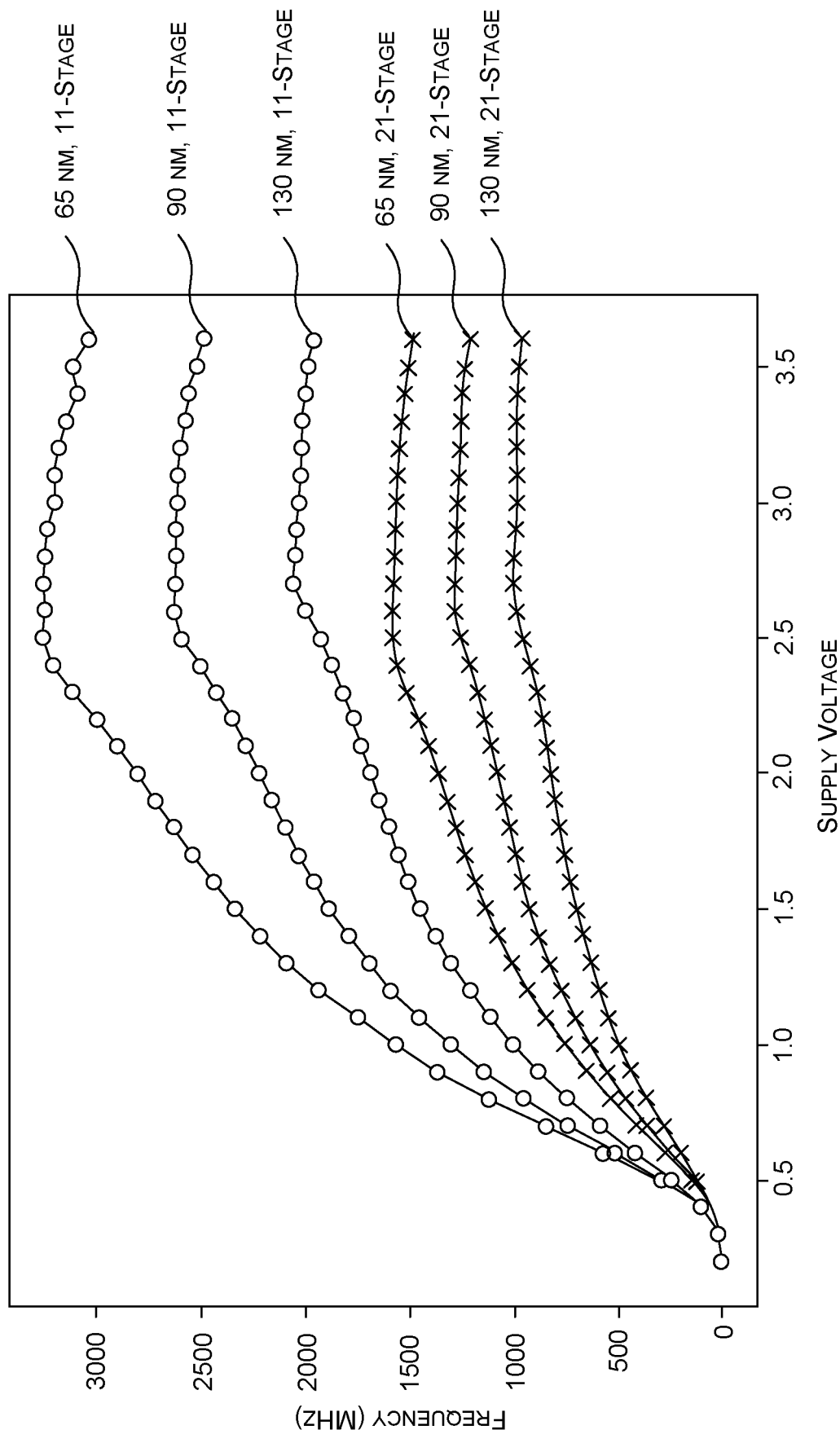
FIG. 6A illustrates an exemplary graph diagram representation of results for simulations using 11-stage and 21-stage ring oscillator circuit such as those shown in FIG. 1, in each transistor technology, according to an example embodiment of the present disclosure.

FIG. 6A illustrates an exemplary graph diagram representation of results for simulations using 11-stage and 21-stage ring oscillator circuit, such as those shown in FIG. 1, in each transistor technology, according to an example embodiment of the present disclosure. The results may be used for key observations motivating and informing the design of the voltage monitoring system 100 and digital voltage monitoring system 200. The high sensitivity of frequency to voltage may enable the ring oscillator circuit 102 to function as a viable supply voltage sensor. The sensitivity increases from moving to smaller processes, thereby implying that the performance of the voltage monitoring system 100 or 200 improves as the transistor technology scales. Decreasing chain length of the ring oscillator circuit 102 may magnify the effects of change in supply voltage, which in turn increases sensitivity of the ring oscillator circuit 102. Further, regardless of length or feature size of the ring oscillator circuit 102, the output frequency may be less sensitive to increase in the supply voltage, and eventually the sensitiveness decreases at a higher supply voltage. In an exemplary embodiment, the ring oscillator circuit 102 may need to operate in the low-voltage, and a high-sensitivity voltage region to reduce voltage error.

As illustrated in FIG. 6A, the frequency-voltage curve for each ring oscillator circuit 102 may be a steepest at lower voltages, leveling off around, for example, 2.5 V and decreasing at higher voltages. The recommended operating voltage for microcontroller units (MCU) 522 used in the energy harvesting systems may be 1.8V-3.6V. For current energy harvesting systems, connecting the oscillator circuit 102 directly to the supply voltage implies that the ring oscillator circuit 102 may operate primarily in the less-sensitive region. Furthermore, the voltage-frequency relationship at high voltages may be a non-monotonic, which complicates the mapping in the hardware processor 202 from the output frequency to a pre-defined supply voltage. To maximize the voltage sensitivity of the digital voltage monitoring system 200 to change in the supply voltage and retain the voltage-frequency relationship monotonic, the ring oscillator circuit 102 may operate at a reduced voltage produced by the transistor-based voltage divider circuit 104 shown in FIGS. 1 and 2. This provides the added benefit of reducing power consumption.

Assuming a standard n-well process for a transistor, which exposes a bulk connection of p-channel metal-oxide semiconductor (pMOS) transistors, the transistor-based voltage divider circuit 104 may include a diode-connected pMOS devices 114 with the bulk terminal BT connected to the source terminal ST. This ensures that each diode connected PMOS devices 114 may be biased identically even as the gate voltage with respect to ground of successive transistors drops. The gate-source voltage (V g s) for each transistor may be small, limiting the current draw of the divider. This design parallels a resistive voltage divider circuit, however, the use of transistors enables wholly digital integrated circuits (ICs). The drawback of the transistor version is that they become non-linear at extremely low and high voltages, however, the voltages are well beyond the specified operating voltage range of the microcontroller units 522. The ring oscillator circuit 102 may extract power from a node n-pMOS transistors away from the ground ($V_{ground}$). In the transistor-based voltage divider circuit 104 consisting of m diode-connected devices 114, the supply voltage ($V_{supply}$) of the ring oscillator circuit 102 may be as shown in equation 3 below:

$$Vro = Vsupply * \frac{n}{m} \qquad \text{Equation 3}$$

Further, the transistor-based voltage divider circuit 104 may set an operating range for the ring oscillator circuit 102, to allow the circuit designer to tune the ring oscillator circuit 102 to operate in the most-sensitive voltage region or the preferred voltage region. The voltage level shifter circuit 106 may level-shift the output signal from the ring oscillator circuit 102 compatible with the voltage level used by a digital logic of the counter circuit 108, reducing power consumption and ensuring reliable operation. The enable signals EN1, EN2 as shown in FIG. 1 may drive both an input to the NAND gate closing the ring oscillator circuit 102 loop and an N-type MOS device (NMOS) at the bottom of the transistor-based voltage divider circuit 104, respectively. The enable signals EN1, EN2 allows the circuit designer to change the duty cycle of the ring oscillator circuit 102, thereby reducing dynamic power consumption. Further, breaking the odd-numbered chain of inverting logic gates 112 in the ring oscillator circuit 102 with the enable signal EN1 may set each gate of each inverting logic gates 112 to a known state before the signal begins oscillating to prevent higher harmonic output frequencies. Finally, the counter circuit 108 may provide the output of the ring oscillator circuit 102 to the intermittent computation circuit 204 shown in FIG. 2, in the form of an edge count accumulated during the sampling period. The hardware processor 202 may map the resulting counter values to the pre-defined supply voltage values using enrollment data stored in a non-volatile memory (NVM) or any other storage/database (not shown).

Further, the equation 1 shown above may be used to choose length of the odd-numbered chain of inverters in the ring oscillator circuit 102. According to equation 1, the voltage sensitivity of the voltage monitoring system 100 may scale proportionally to '1/n', where the variable 'n' may be the length of the ring oscillator circuit 102. A given change in supply voltage ($V_{supply}$) produces a corresponding frequency change that is larger in shorter ring oscillator circuit, because a smaller 'n' magnifies the impact of a change in a gate delay 'T d' on the oscillation frequency. For the ring oscillator circuit 102 implemented in the same technology, a given voltage change produces the same proportional frequency change regardless of the number of the ring oscillator stages, however, the voltage monitoring system 100 may measure the absolute change in frequency. A higher change in frequency may require a shorter enable period (i.e., using enable signal) to detect. A shorter enable period allows the voltage monitoring system 100 to implement either at a lower duty cycle (consuming less power, because the ring spends less time enabled) or at a higher sampling rate. An enable period (i.e., the amount of time the ring oscillator circuit 102 is powered to produce a single sample), and a sample period (i.e., the time between distinct samples) and their impact on the voltage monitoring system 100 is disclosed below in more detail. Further, the dynamic power consumed by the ring oscillator circuit 102 may not be dependent on its length, as only one inverting logic gate 112 is switching at a time. Increasing the size of the ring oscillator circuit 102 increases area overhead and static power. However, the voltage monitoring system 100 may consume negligible power and area compared to existing microcontrollers or voltage monitoring circuits. Further, the ring oscillator circuit 102 that oscillate too fast for a given sampling period may overflow a counter. Thus, the counter bit-width, sampling period, and the ring oscillator length are interconnected. Based on these constraints, the circuit designer may analyze the ring oscillator length primarily to the extent that it affects accuracy and power draw by setting a minimum duty cycle.

The accuracy of the voltage monitoring system 100 or 200 may depend largely on a sampling rate and a duty cycle as shown in equation 4 below.

$$D = \frac{Ten}{Tsample} \leq 1. \qquad \text{Equation 4}$$

In the above equation 4, the variable '$T_{en}$' may be a time per sample during which the voltage monitoring system 100 or 200 may be enabled, and the variable '$T_{sample}$' may be the sampling period. A higher '$T_{en}$' may enable the voltage monitoring system 100 to discriminate between finer ring oscillator frequency, and the supply voltage changes. The output of the voltage monitoring system 100 is in the form of a count as shown in equation below.

$$C = fro * Ten \qquad \text{Equation 5}$$

The edge sensitive nature of the counter implies that decimal values of 'C' may be effectively truncated. Therefore, the minimum detectable change in ring oscillator frequency is $1/T_{en}$. The bit-width 'n' of the counter may limit the maximum value of 'C' to $2^n-1$. Further, all possible values of $f_{ro}*T_{en}$ in equation 5 may need to be below this maximum value to prevent counter overflow. Increasing '$T_{en}$' increases both accuracy and power consumption, which scales directly with a duty cycle. Given that, low-resolution and low-frequency (compared to ADCs) measurements of the supply voltage are sufficient for current and near-future energy harvesters, operating the voltage monitoring system 100 with a low duty cycle enables signifimayt power savings at a low cost. A sufficiently low duty cycle also reduces counter size and its power. Evaluation of the relationship between duty cycle, power, and accuracy is disclosed in more detail below.

Further, to maximize the voltage sensitivity, there are many factors such as inverter cell choice, ring oscillator operating voltage, and the like. The change in the supply voltage in the voltage monitoring system 100 may be the quantity of interest. The voltage sensitivity is maximized to change in the supply voltage by using the inverter available consisting of single pMOS and nMOS transistors connected directly to the supply voltage and ground, respectively. The basic inverter design has additional benefits, as this reduces the total transistor count and is implementable using digital-only standard cell libraries.

Figure 6B:
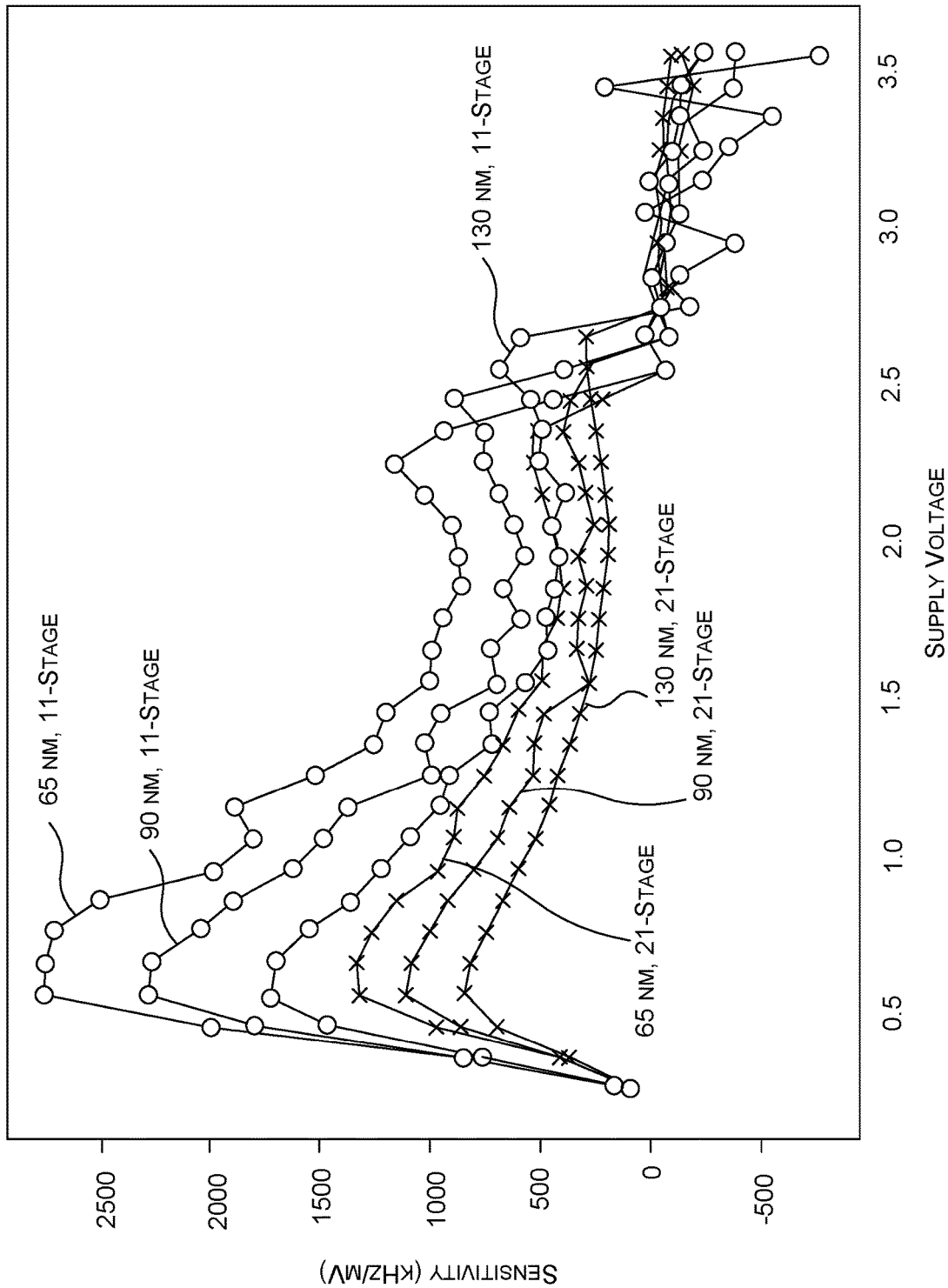
FIG. 6B illustrates an exemplary graph diagram representation of a voltage division ratio on a sensitivity curve of a ring oscillator circuit, for several ring oscillator lengths and logic gate technologies, according to an example embodiment of the present disclosure.

The voltage division ratio on a sensitivity curve of the ring oscillator circuit 102, for several ring oscillator lengths and logic gate technologies is shown in FIG. 6B. Reducing the voltage seen by the ring oscillator circuits 102 tends to increase sensitivity; however, this may also reduces the voltage change seen by the ring oscillator circuit for a corresponding change at a supply rail. The sensitivity gain 'G' may be defined using equation 6 below.

$$G = \frac{\overline{S_{new}}}{\overline{S_{old}}} * \frac{n}{m} \qquad \text{Equation 6}$$

In the above equation 6, the variables $\overline{S_{new}}/\overline{S_{old}}$ reflect an average sensitivity in new and old operating regions, respectively. The optimal division ratio is the one that maximizes 'G' and is transistor technology dependent. The optimal ratios implementable in a smaller number of transistors are n/m=1/3 or 1/2; each of these division ratios produces a sensitivity gain of G≈2. Between division ratios that produce the same voltage sensitivity gain for a given process, the smaller number of transistors may reduce power consumption, by reducing the operating voltage of the ring oscillator circuit 102. Thus, select n/m=1/3 are selected. Assuming that the transistors are well-matched, the unloaded output of the transistor-based voltage divider circuit 104 may be a reliable fractional value of the supply voltage $V_{supply}$. However, enabling the ring oscillator circuit to draw power from the transistor based voltage divider circuit 104 reduces the effective resistance between the divider output and ground, which results in a voltage drop and the $V_{ro}$ below the nominal value. To compensate for the voltage, drop, increasing the width of certain transistors, the transistors may be widened between the voltage divider output and $V_{supply}$. This is to increase the current delivered to the ring oscillator circuit 102 and reduce the magnitude of the voltage drop. Appropriate transistor sizing reduces, however, does not eliminate the voltage drop seen at '$V_{ro}$', because the proportional error depends on the value of '$V_{supply}$'.

Further, a digital complementary metal oxide silicon (CMOS) gates may depend on well-defined input signals to achieve high speed and low power. An input may need to be either close to the supply voltage or close to the ground voltage to switch the component transistors fully and rapidly. Further, operating the ring oscillator circuit 102 at a fraction of the supply voltage increases voltage sensitivity and decreases the power consumption by the voltage monitoring system 100. This implies that providing the logical '1' output of the ring oscillator circuit 102 directly to the input of the counter circuit 108 (operating at the normal supply voltage) violates the fundamental assumption of digital CMOS logic. The low voltage ring oscillator circuit 102 at logical '1' may provide a margin for noise. Further, the low voltage ring oscillator circuit 102 at consistently below the core voltage logical '1' level, may produce a signal that is unrecognizable to the core voltage. Interpreting the ring oscillator circuit 102 output as a logical '1' corresponding to the core voltage, driving CMOS gates with a low voltage '1' increases power consumption. The power consumption may be due to ohmic losses from partially-on transistors and current in a low-impedance path to the ground voltage.

The voltage difference is resolved using the voltage level shifter circuit 106 shown in FIGS. 1 and 2. The voltage level shifter circuit 106 may be a self-reinforcing circuit leveraging the common ground of both voltage domains to boost the ring oscillator circuit 102 output voltage to the core voltage. Finally, the hardware processor 202 may need to measure the frequency of the ring oscillator circuit 102 to make decisions based on the supply voltage. The output from the ring oscillator circuit 102 may be measured using the counter circuit 108 as shown in FIG. 2. The counter circuit 108 may increment a count value on every positive edge of the output of the voltage level shifter circuit 106. The measurement may be sent to a digital comparator (not shown) for interrupt generation, which is then provided to the hardware processor 202.

The counter circuit 108 may map the output frequency of the ring oscillator circuit 102 to a count value. The final step is mapping the count value to the supply voltage. While the slope of the frequency-voltage relationship is predictable across all ring oscillator circuit, manufacturing-time process variation implies that identical ring oscillator circuit 102 on different chips produce different frequencies under the same conditions. Microcontroller manufacturers address process variation in sensitive circuits. Such sensitive circuits may include clock oscillators and sensors using a post-manufacture enrollment step. This enrollment step includes evaluating the digital voltage monitoring system 200 with known inputs and writing device-specific calibration data to the Flash/ROM before deployment. This enrollment step may be used to increase the precision of the voltage monitoring system 200, by recording the ring oscillator frequency using several known supply voltages. Upon deploying the voltage monitoring system 200, the hardware processor 202 may use these calibration values to determine the supply voltage with reduced error.

Additionally, the circuit designers may increase run-time performance by increasing memory consumption and enrollment effort. The circuit designers may identify and evaluate several enrollment strategies. For a full enrollment, the circuit designers may store a voltage value for every possible output of the digital voltage monitoring system 200. This maximizes accuracy (the voltage-count curve is fully characterized and stored) and speed (mapping a count to a voltage is a simple indexing operation). Also, storing the voltage value for every possible output of the voltage monitoring system 200 also maximizes memory overhead and enrollment effort for each device. Further, for a piecewise-constant interpolation, instead of storing every possible counter output, memory overhead is reduced by the number of data points stored in the NVM. When the counter circuit 108 produces a counter value, the counter value may not be stored in a lookup table. However, the voltage monitoring system 200 may assume the supply voltage is at a level that may be associated with the closest stored count value below the measured value.

The circuit designers may tune the accuracy of the voltage monitoring system 200 by changing the number of stored data points during a runtime count-voltage conversion. Further, a piecewise-linear interpolation may also enable same accuracy-memory tradeoff as the piecewise-constant interpolation. However, the piecewise-linear interpolation is calculated as a linear interpolation between the nearest two points when a count value is not stored. This increases accuracy for the same memory footprint at the cost of increased runtime overhead evaluating the interpolation function. Further, a polynomial interpolation may be used to minimize memory overhead. The enrollment of the polynomial interpolation may characterize the voltage monitoring system 200 at a few supply voltage points and store coefficients for an arbitrary-degree polynomial regression function in the NVM. This enables memory space overhead to be negligible at the cost of runtime performance. However, evaluating the polynomial function requires numerous floating-point multiplication operations.

For a continuous function f(x) with lower and upper bounds a and b, respectively, equations 7 and 8 below describe the respective maximum error for piecewise-linear and piecewise-constant interpolation.

$$E_{const} \leq h * \max_{x \in [a,b]} \left| \frac{df(x)}{dx} \right|$$ Equation 7

$$E_{lin} \leq \frac{h^2}{8} * \max_{x \in [a,b]} \left| \frac{d^2 f(x)}{dx^2} \right|$$ Equation 8

In the above equations 7 and 8, the variable 'f(x)' may refer to a mapping from frequency to voltage for a given ring oscillator, the inverse of the relationship shown in FIG. 6A. Further, the variable 'h' may be the distance between known frequency datapoints and decreases with higher storage consumption in the NVM. Further, for the frequency-voltage transfer function with minimum frequency 'L' maximum frequency H, and 'c' evenly spaced datapoints, is defined as h=(H−L)/c.

Figure 6C:
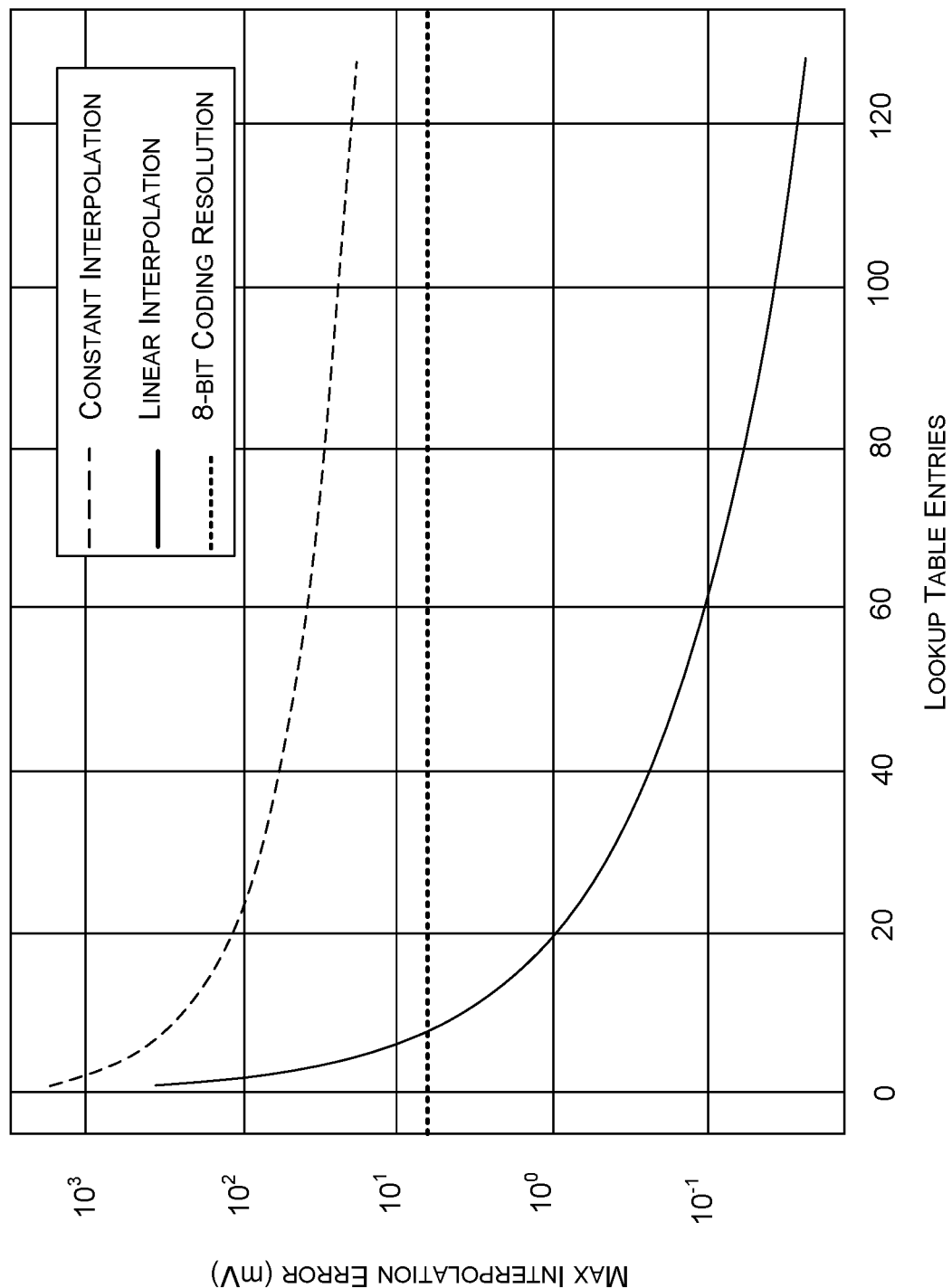
FIG. 6C illustrates an exemplary graph diagram representation of a maximum error introduced by both types of interpolation as a function of a non-volatile memory (NVM) overhead, according to an example embodiment of the present disclosure.

FIG. 6C illustrates an exemplary graph diagram representation of a maximum error introduced by both types of interpolation as a function of a non-volatile memory (NVM) overhead, according to an example embodiment of the present disclosure. As illustrated in FIG. 6C the maximum error is introduced by both types of interpolation as a function of the NVM overhead, assuming that each voltage entry in the table is stored in a single byte. By operating the ring oscillator circuit 102 at a low voltage using the transistor-based voltage divider circuit 104, a linearity is maximized for the voltage-frequency transfer function. This enables highly accurate interpolation with a relatively less NVM footprint. The linear interpolation scales better than constant interpolation with increasing storage overhead in the NVM, but both eventually achieve diminishing returns as other sources of error such as temperature begin to dominate error of the voltage monitoring circuit. The precision of the recorded data points also limits interpolation accuracy, as shown in FIG. 6C. Assuming 1.8 V supply range, interpolating between 8-bit values may not reduce the total error below 1.8V/28≈7 mV.

Experimental Results

The voltage monitoring system 100 and 200 may be evaluated using two implementations, each targeting different aspects of the design: (1) a simulation program with integrated circuit emphasis (SPICE) implementation, and (2) a field-programmable gate array (FPGA) implementation.

For example, the SPICE implementation may be used to drive circuit design exploration and evaluate the effects of the supply voltage, feature size, and performance of the analog circuit components in the voltage monitoring system 100 and 200. To explore the effects of run time variation, such as temperature and to demonstrate the voltage monitoring system 100 and 200 on a hardware, the voltage monitoring system 100 and 200 may be integrated into a reduced instruction set computer-five (RISC-V®) processor running on a field programmable gate array (FPGA).

Figure 6D:
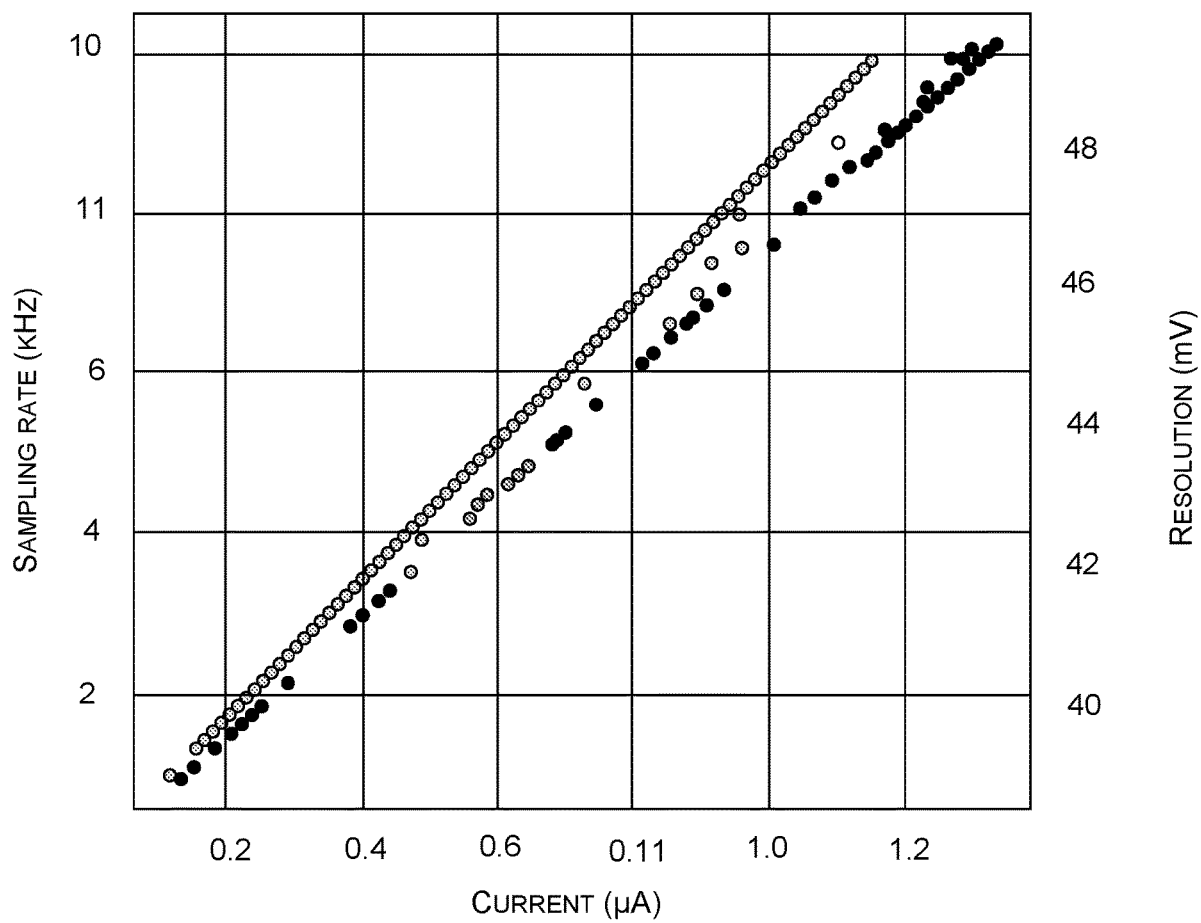
FIG. 6D illustrates an exemplary graph diagram representation of a trade space and a current-resolution-sample rate for the voltage monitoring system in 90 nm technology, according to an example embodiment of the present disclosure.
Figure 6E:
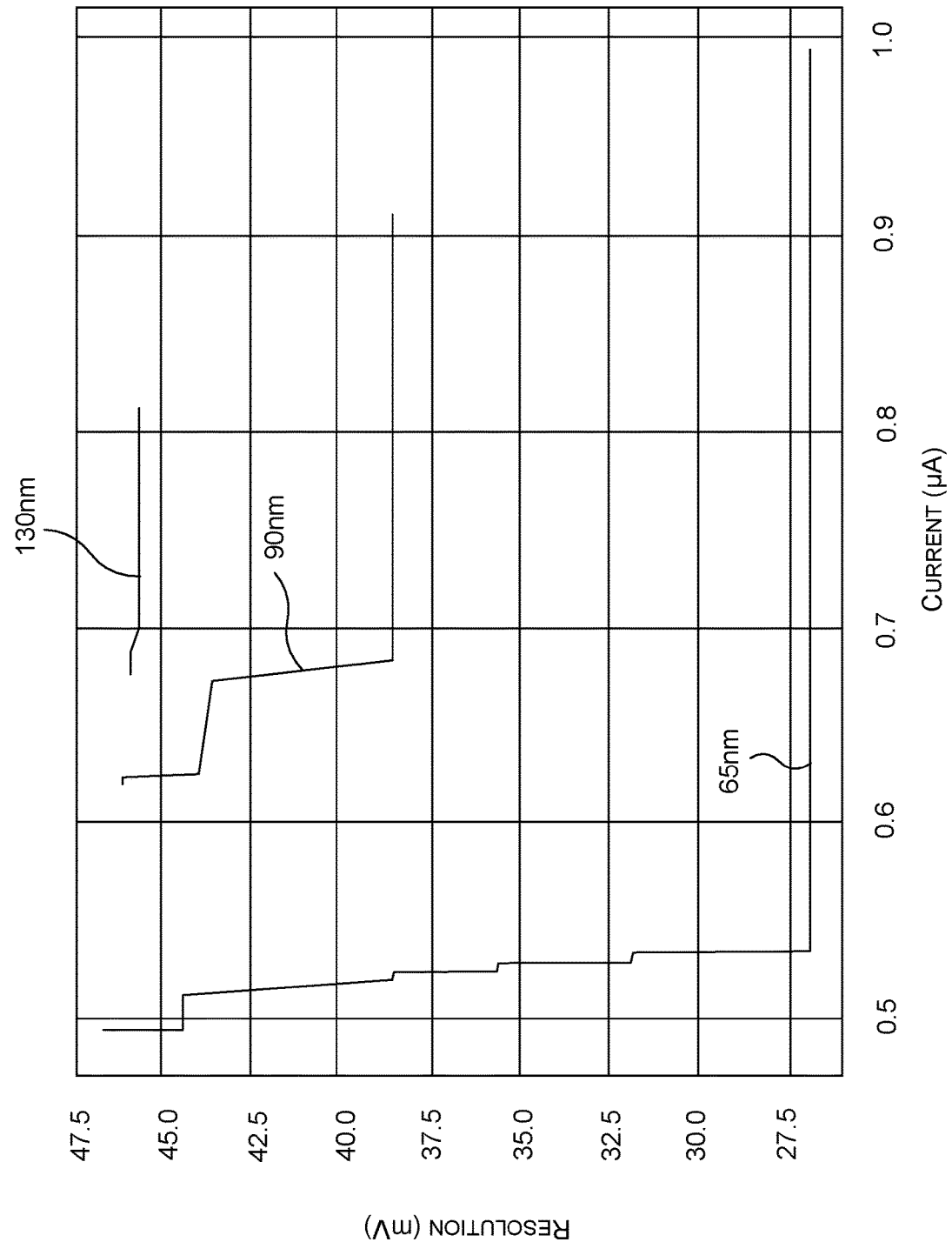
FIG. 6E illustrates an exemplary graph diagram representation of a sample rate, and smaller feature sizes to enable both lower current and finer resolution operation for the voltage monitoring system, according to an example embodiment of the present disclosure.

FIG. 6D illustrates an exemplary graph diagram representation of a trade space and a current-resolution-sample rate for the voltage monitoring system 100 and 200 in 90 nm technology, according to an example embodiment of the present disclosure. FIG. 6D illustrates a trade space for the voltage monitoring system 100 and 200 in 90 nm technology. Each point in the graph of the FIG. 6D may denote a performance of a different Pareto-optimal configuration. Further, FIG. 6D illustrates the current-resolution-sample rate trade space accounting for the temperature-induced limit, reducing sampling granularity (e.g., from 38 mV to 48 mV). The reduced sampling granularity implies that a current consumption by, for example, 14% at the highest sampling rate of 10 kHz. Further, assuming a 1.8V dynamic range illustrated in FIG. 6E, the voltage monitoring system 100 and 200 may provide, for example, between 5 and 6 bits of resolution depending on feature size while consuming, in total, less than 1 µA. This enables sophisticated energy harvesting systems with negligible power overhead. Further, as illustrated in FIG. 6E, the voltage monitoring system 100 and 200, at the same sample rate, smaller feature sizes, enables both lower current and finer resolution operation. The results indicate that the voltage monitoring system 100 and 200 effectively removes the power/size restriction of highly analog circuits and enables energy harvesters to better leverage the advantages of transistor scaling.

Figure 6F:
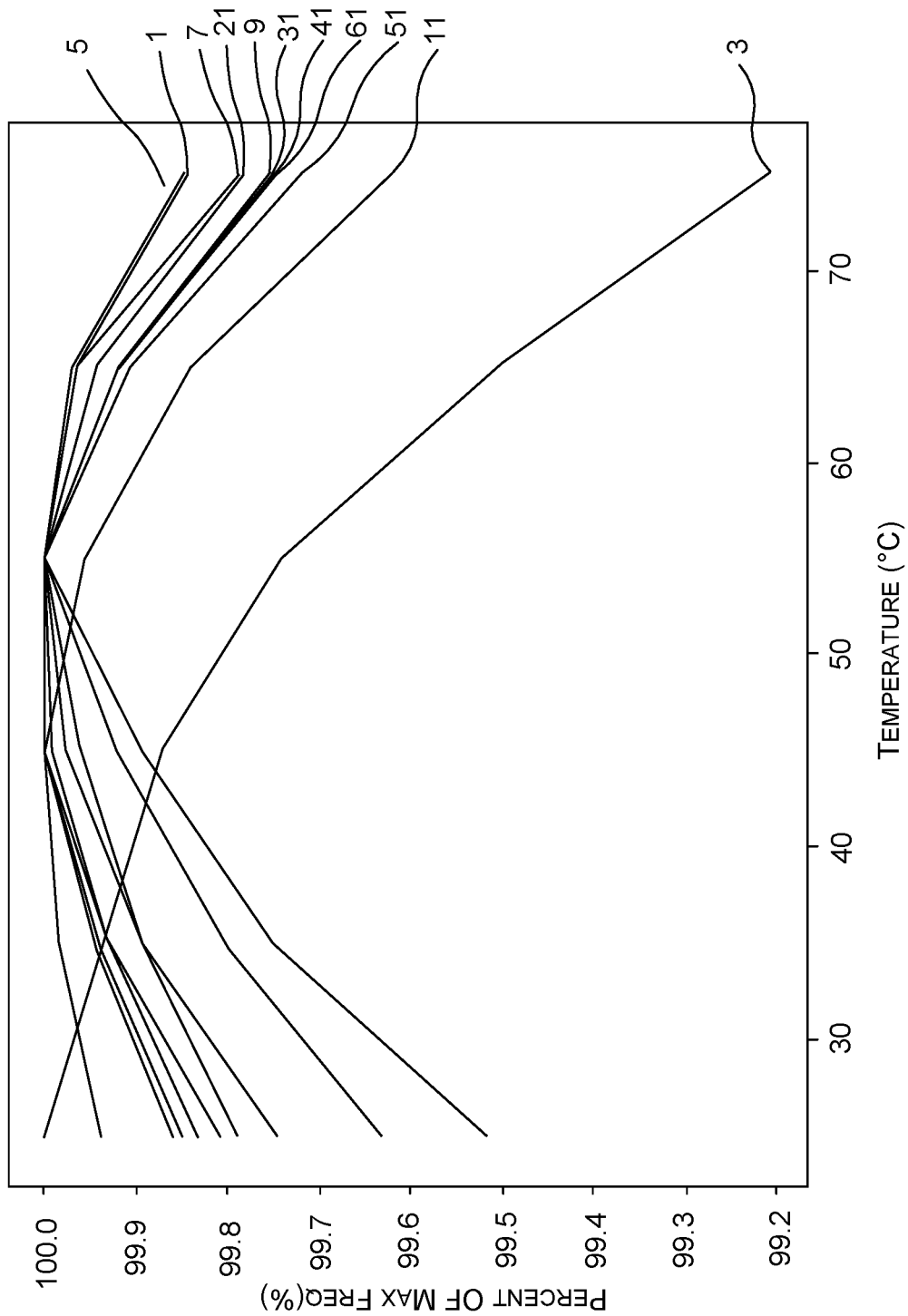
FIG. 6F illustrates an exemplary graph diagram representation of a relative change in frequency across temperatures for a plurality of implemented ring oscillator circuit, according to an example embodiment of the present disclosure.

FIG. 6F illustrates an exemplary graph diagram representation of relative change in frequency across temperatures for a plurality of implemented ring oscillator circuit 102, according to an example embodiment of the present disclosure. Consider, a temperature-induced error to be the largest frequency change between any two frequencies. Similar to voltage-induced changes, temperature-induced changes may be similar across ring oscillator circuit 102 sizes, due to switching of only one gate at a time. Further, 1% maximum effect is illustrated in FIG. 6F to create a conservative, worst-case 2% thermal error. This error fits past work measuring ring oscillator circuit 102 and a delay line sensitivity to temperature.

Figure 6G:
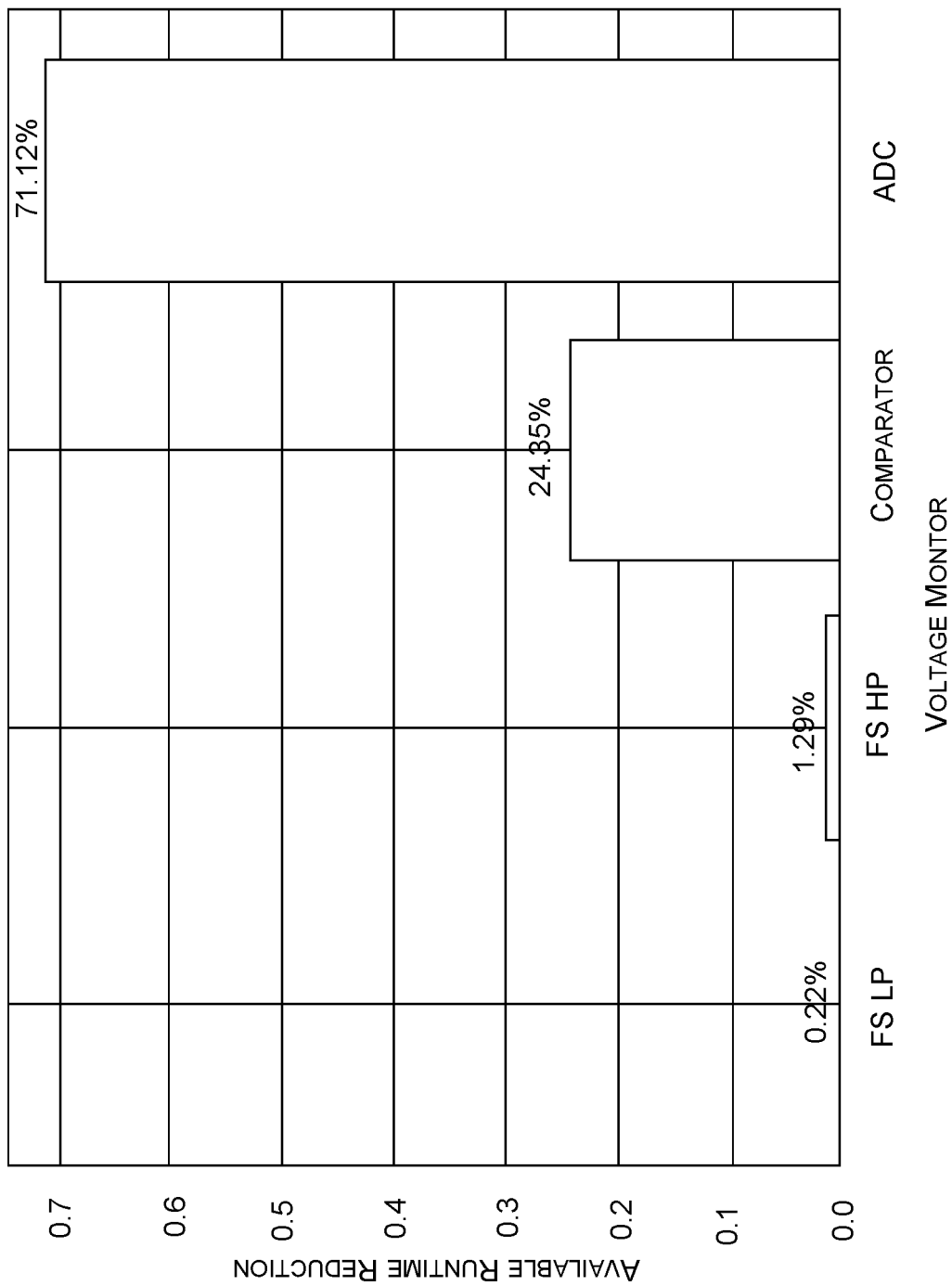
FIG. 6G illustrates an exemplary graph diagram representation of a performance improvement of the voltage monitoring system over analog-based alternatives for checkpointing circuits, according to an example embodiment of the present disclosure.

FIG. 6G illustrates an exemplary graph diagram representation of a performance improvement of voltage monitoring system 100 and 200 over analog-based alternatives for checkpointing circuits, according to an example embodiment of the present disclosure. As illustrated in a graph in FIG. 6G, the performance is improved for the voltage monitoring system 100 and 200 over analog-based alternatives for checkpointing circuits. Each of the runtime results are normalized to performance using an ideal voltage monitor, representing perfect sampling and zero overhead from monitoring hardware such as the voltage monitoring system 100 and 200. Both implementations of the voltage monitoring system 100 and 200 achieve near-ideal runtime, compared to the 24% and 70% runtime penalties of the analog solutions. This depicts the ability of the voltage monitoring system 100 and 200 to maximize the time and energy available for an application.

FIG. 7A illustrates an exemplary graph diagram representation of a measured power conversion efficiency (PCE) of the rectenna 304, according to an example embodiment of the present disclosure. The measured PCE versus the received power by the rectenna 304 may be plotted in a graph as illustrated in FIG. 7A. A maximum PCE of 52% may be achieved at the received power of −1.9 dBm by the rectenna with a load resistance of 5.8 KΩ, in which the output voltage at the load resistor is 1.41 V. The charging time of the load capacitor $C_L$ may be measured as shown in the graph of FIG. 7A. The load resistance $R_L$ is fixed to 1 MW for the measurements, and three different capacitances, CL=4.7 mF, 330 mF, and 2.2 mF, are used. The TX antenna gain is 8 dB, the connection loss is 2 dB, and the distance between the TX and RX is set to 45 cm. Free space path loss (FSPL) is 33.9. Three different transmitted power levels, 15.2, 10, and 5 dBm are considered for the measurements. The received signal of the rectenna is single-tone CW. The rising time 'tr' of the capacitor voltage is defined as the time taken from 10% to 90% of the final voltage. The PCE may be calculated as shown in equation 2 above.

FIG. 7B illustrates an exemplary graph diagram representation of voltage waveforms across the load capacitor $C_L$ such as those shown in FIG. 3B, according to an example embodiment of the present disclosure. As depicted, the capacitance increases with an increase in rising time 'tr'. Table. 2 below provides the rising times and final voltages for the three different capacitances under three different power levels received at a reception antenna (Rx). As '$C_L$' increases from 4.7 mF to 2.2 mF, the rising time increases from 0.09 seconds to 31 seconds. The received power decreases from 52 μW to 5 μW, the final voltage decreases from 1.3 V to 0.21 V. The final voltage across the $C_L$ may be dependent only on the power level, however independent of the '$C_L$'.

TABLE 2

| Load Capacitance $C_L$ (μF) | Rising Time (S) | Final Voltage Across Load Capacitor | | |
|---|---|---|---|---|
| | | $P_{received}$ = 52 μW | $P_{received}$ = 16 μW | $P_{received}$ = 5 μW |
| 4.7 | 0.09 | 1.3 V | 0.5 V | 0.21 V |
| 330 | 5.00 | 1.3 V | 0.5 V | 0.21 V |
| 2200 | 31.00 | 1.3 V | 0.5 V | 0.21 V |

The above rectenna 304 shown in FIG. 3B may successfully demonstrate radio frequency (RF) energy harvesting from a, for example, 5G communication. To power the cryptography processor such as 5G crypto circuit 508 in FIG. 5A, it is necessary to increase the amount of energy harvested. Consider the modifications and extensions for improvement of the rectenna 304. The modification may include an increase in the load voltage. The current rectenna has a single rectifier stage, and the final voltage across the load capacitor $C_L$ is 1.3 V DC under the received power level perceived=52 μW as shown in Table 2. The load voltage is too low to power a typical cryptography processor, and the load voltage (equally the amount of harvested energy) may be increased by increasing the number of rectifier stages as illustrated in FIG. 3B. Another modification may include the multi-band energy harvester shown in FIG. 4A, array of antennas shown in FIG. 4B, antenna beamforming shown in FIG. 4C, extended peak range for the PCE shown in FIG. 7C, increase the operating frequency up to the mm-wave range (e.g., 28 GHz), include a power management circuit (PMC) with maximum power point tracking (MPPT), harvest energy from other energy sources, and the like.

FIG. 7C illustrates an exemplary schematic diagram representation of an extended peak range for power conversion efficiency (PCE), according to an example embodiment of the present disclosure. The maximum PCE may be achieved over a wider range of input power through reduction of parasitic, which may require fabrication of an integrated circuit (IC). Further, increasing the operating frequency up to the mm-wave range (e.g., 28 GHz.) enables the energy harvester to harvest RF energy at the mm-wave frequency range such as 28 GHz for 5G communications. Consider a scenario of a power management circuit (PMC) with maximum power point tracking (MPPT). The PMC with MPPT may regulate the load voltage while maximizing the amount of energy extraction from the rectenna 304. A low power design of the PMC may be a major design issue. Consider another scenario of harvesting energy from other energy sources. Energy harvesting from various energy sources such as solar, vibration, and thermal may enable the energy harvesting system to operate more reliably.

FIG. 7D illustrates an exemplary graph diagram representation of results for combination of the fifth generation (5G) energy harvester with intermittent computation circuit 500A shown in FIG. 5A using an open-source software and systems that enable secure 5G and subsequent mobile networks such as 6G, according to an example embodiment of the present disclosure.

FIG. 8 illustrates an exemplary flow diagram representation of a method 800 for harvesting energy using the digital voltage monitoring system 200, according to an example embodiment of the present disclosure.

At block 802, the method 800 may include measuring, by the hardware processor 202, a voltage dependent ring oscillator frequency at a ring oscillator circuit 102 for a range of supply voltage levels.

At block 804, the method 800 may include determining, by the hardware processor 202, a performance parameter for each of the measured voltage dependent ring oscillator frequency, the performance parameter including a resolution level and a sample rate.

At block 806, the method 800 may include generating, by the hardware processor 202, a level shifted output signal by shifting voltage level of the ring oscillator circuit 102 to a voltage level required by an intermittent computation circuit 204 based on the determined performance parameter.

At block 808, the method 800 may include generating, by the hardware processor 202, a count value during a sampling period by incrementing an initial count value for each positive edge of the generated level-shifted output signal.

At block 810, the method 800 may include determining, by the hardware processor 202, an optimal supply voltage value for the intermittent computation circuit 204 by mapping the count value to values of a pre-defined supply voltage.

At block 812, the method 800 may include identifying, by the hardware processor 202, an available energy level for computation based on the generated count values and the determined optimal supply voltage value, the available energy level corresponds to a n-bit value stored onto a destination register of the intermittent computation circuit 204.

The method 800 may be implemented in any suitable hardware, software, firmware, or combination thereof. The order in which the method 800 is described is not intended to be construed as a limitation, and any number of the described method blocks may be combined or otherwise performed in any order to implement the method 800 or an alternate method. Additionally, individual blocks may be deleted from the method 800 without departing from the spirit and scope of the present disclosure described herein. Furthermore, the method 800 may be implemented in any suitable hardware, software, firmware, or a combination thereof, that exists in the related art or that is later developed. The method 800 describes, without limitation, the implementation of the voltage monitoring system 100 or 200. A person of skill in the art will understand that method 800 may be modified appropriately for implementation in various manners without departing from the scope and spirit of the disclosure.

One of the ordinary skill in the art will appreciate that techniques consistent with the present disclosure are applicable in other contexts as well without departing from the scope of the disclosure.

What has been described and illustrated herein are examples of the present disclosure. The terms, descriptions, and figures used herein are set forth by way of illustration only and are not meant as limitations. Many variations are possible within the spirit and scope of the subject matter, which is intended to be defined by the following claims and their equivalents in which all terms are meant in their broadest reasonable sense unless otherwise indicated.

What is claimed is:

1. A voltage monitoring system comprising:
    a ring oscillator circuit comprising a delay line circuit, wherein the delay line circuit comprises a series of inverting logic gates, each of the inverting logic gates comprising a first input terminal, a second input terminal and an intermediate output terminal, the series of inverting logic gates comprising a final inverting logic gate comprising a first input terminal, a second input terminal, an enable input terminal and a final output terminal, and the final output terminal of the final inverting logic gate being looped to the first input terminal of a first inverting logic gate to form a self-oscillating feedback loop;
    a transistor-based voltage divider circuit connected to the ring oscillator circuit via the second input terminal of the inverting logic gates, the transistor-based voltage divider circuit comprising a plurality of diode connected transistor devices with each bulk terminal of diode connected transistor device connected to each source terminal of the diode connected transistor device, the plurality of diode connected transistor devices comprising a final diode connected transistor device fed with an enable signal at a gate terminal of the final diode connected transistor device;
    a voltage-level shifter circuit connected to the ring oscillator circuit via an intermediate output terminal of the inverting logic gates; and
    a counter circuit connected to the voltage-level shifter circuit via an output terminal of the voltage-level shifter circuit, the counter circuit being connected to an external system for harvesting energy to perform a computational task.

2. The voltage monitoring system of claim 1, wherein the ring oscillator circuit is to:
    generate a ring oscillator frequency as a function of change in a supply voltage, and the ring oscillator frequency being dependent on an average gate delay of the inverting logic gates, and the average gate delay being directly proportional to at least one of a change in a diode connected transistor device size and the supply voltage.

3. The voltage monitoring system of claim 1, wherein the ring oscillator circuit is further to:
    generate an output voltage level, the output voltage level of the ring oscillator circuit being lesser than an output voltage of the transistor-based voltage divider circuit, the output voltage of the transistor-based voltage divider circuit is a fractional value of the supply voltage; and
    extract power from the transistor-based voltage divider circuit resulting in a voltage drop below a nominal voltage value, and the voltage drop being rectified by increasing width of the plurality of diode connected transistor devices.

4. The voltage monitoring system of claim 1, wherein the ring oscillator circuit is to:
    measure a change in a ring oscillator frequency, wherein, when the change in the ring oscillator frequency is higher, an enable period of the ring oscillator circuit is decreased for operating the voltage monitoring system at one of a lower duty cycle and at a higher sampling rate, and the enable period corresponds to amount of time the ring oscillator circuit is powered to generate at least one sample and the sampling rate corresponds to a time between a distinct sample.

5. The voltage monitoring system of claim 1, wherein the transistor-based voltage divider circuit is to:
    set an operating range for the ring oscillator circuit to tune the ring oscillator circuit to operate in a preferred voltage region, and the enable signal being fed to the gate terminal of the final diode connected transistor device changes a duty cycle of the ring oscillator circuit.

6. The voltage monitoring system of claim 5, wherein the preferred voltage region is determined based on a type of inverting logic gates and a ring oscillator operating voltage.

7. The voltage monitoring system of claim 1, wherein the voltage-level shifter circuit is to:
    receive an intermediate output signal from the intermediate output terminals of the inverting logic gates, wherein the intermediate output signal comprises an output voltage level;
    determine voltage difference between the output voltage level and a voltage level required by an intermittent computation circuit; and
    generate a level-shifted output signal based on the determined voltage difference by shifting the output voltage level to the voltage level required by the intermittent computation circuit, wherein the level-shifted output signal comprises a voltage level required by the intermittent computation circuit.

8. The voltage monitoring system of claim 7, wherein the output voltage is shifted to the voltage level required by the intermittent computation circuit using a common ground of the transistor-based voltage divider circuit and the voltage-level shifter circuit to boost the output voltage.

9. The voltage monitoring system of claim 1, wherein the counter circuit is to:
    generate a count value based on a ring oscillator frequency and a time per sample during which the voltage monitoring system is enabled.

10. The voltage monitoring system of claim 9, wherein the count value corresponds to a number of times an output signal from the final inverting logic gate traverses the self-oscillating feedback loop of the ring oscillator circuit during a fixed time period, and the count value indicates an available energy level in a buffer capacitor.

11. The voltage monitoring system of claim 10, wherein the count value is transmitted to a digital comparator for generating an interrupt signal and a request for determining available energy level in the buffer capacitor to perform the computational task.

12. The voltage monitoring system of claim 1, wherein the ring oscillator circuit comprises an odd-numbered series of inverting logic gates to generate a ring oscillator frequency which is inversely proportional to a supply voltage.

13. The voltage monitoring system of claim 1, wherein the ring oscillator circuit comprises a rate of oscillation depending on a propagation delay of the inverting logic gates, and the propagation delay in the ring oscillator circuit being based on a supply voltage of the voltage monitoring system.

14. The voltage monitoring system of claim 1, wherein the ring oscillator circuit comprises a voltage sensitivity which increases based on a chain length of the series of inverting logic gates.

15. The voltage monitoring system of claim 1, wherein the ring oscillator circuit is operated at a low voltage level to maximize linearity of a voltage-frequency transfer function.

16. A computing system for harvesting energy comprising:
   a hardware processor;
   an intermittent computation circuit communicatively connected to the hardware processor, the intermittent computation circuit is to monitor a buffer capacitor voltage for the intermittent computation circuit;
   a voltage monitoring system communicatively coupled to the intermittent computation circuit via the hardware processor, the voltage monitoring system comprises:
      a transistor-based voltage divider circuit to tune a ring oscillator circuit by operating the ring oscillator circuit in a preferred voltage region, the transistor-based voltage divider circuit being supplied with a supply voltage;
      the ring oscillator circuit to generate a voltage dependent ring oscillator frequency based on a tapped voltage of the transistor-based voltage divider circuit;
      a voltage-level shifter circuit to generate a level shifted output signal by shifting a voltage level of an intermediate output signal received from the ring oscillator circuit, the generated level-shifted output signal corresponds to a voltage level required by the intermittent computation circuit; and
      a counter circuit to generate a count value during a sampling period by incrementing an initial count value for each positive edge of the level-shifted output signal; and
   the intermittent computation circuit is to determine available energy level for computation by monitoring the buffer capacitor voltage for the intermittent computation circuit, the buffer capacitor voltage being monitored by mapping the count value to values of a pre-defined supply voltage.

17. The computing system of claim 16, wherein the computing system further comprises a memory coupled to the hardware processor, wherein the memory comprises a set of instructions stored in the form of executable program, which when executed by the hardware processor, cause the hardware processor to:
   measure the voltage dependent ring oscillator frequency for a range of supply voltage levels;
   determine a performance parameter for each of the measured voltage dependent ring oscillator frequency, the performance parameter comprising a resolution level and a sample rate;
   generating a level shifted output signal by shifting the voltage level of an intermediate output signal to a voltage level required by the intermittent computation circuit based on the determined performance parameter;
   generating the count value during a sampling period by incrementing an initial count value for each positive edge of the generated level-shifted output signal;
   determining an optimal supply voltage value for the intermittent computation circuit by mapping the count value to values of the pre-defined supply voltage; and
   identifying an available energy level for computation based on the generated count values and determined optimal supply voltage value, the available energy level corresponds to a n-bit value stored onto a destination register of the intermittent computation circuit.

18. The computing system of claim 16, wherein the buffer capacitor voltage is monitored by mapping the count values to a values of a pre-defined supply voltage using a data point stored in a non-volatile memory (NVM).

19. The computing system of claim 16, wherein the intermittent computation circuit is further connected to an energy harvesting system.

20. A method for harvesting energy using a digital voltage monitoring system, the method comprising:
   measuring, by a hardware processor, a voltage dependent ring oscillator frequency at a ring oscillator circuit for a range of supply voltage levels;
   determining, by the hardware processor, a performance parameter for each of the measured voltage dependent ring oscillator frequency, the performance parameter comprising a resolution level and a sample rate;
   generating, by the hardware processor, a level shifted output signal by shifting voltage level of the ring oscillator circuit to a voltage level required by an intermittent computation circuit based on the determined performance parameter;
   generating, by the hardware processor, a count value during a sampling period by incrementing an initial count value for each positive edge of the generated level-shifted output signal;
   determining, by the hardware processor, an optimal supply voltage value for the intermittent computation circuit by mapping the count value to values of a pre-defined supply voltage; and
   identifying, by the hardware processor, an available energy level for computation based on the generated count values and the determined optimal supply voltage value, the available energy level corresponds to a n-bit value stored onto a destination register of the intermittent computation circuit.

* * * * *